United States Patent
Kanno et al.

[11] Patent Number: 5,946,184
[45] Date of Patent: Aug. 31, 1999

[54] ELECTROSTATIC CHUCK, AND METHOD OF AND APPARATUS FOR PROCESSING SAMPLE

[75] Inventors: Seiichiro Kanno; Tatehito Usui, both of Chiyoda-machi; Ken Yoshioka; Saburo Kanai, both of Hikari; Youichi Itou, Kudamatsu, all of Japan

[73] Assignee: Hitachi, Ltd., Tokyo, Japan

[21] Appl. No.: 08/927,278

[22] Filed: Sep. 11, 1997

[30] Foreign Application Priority Data

Sep. 19, 1996 [JP] Japan .................................. 8-247536

[51] Int. Cl.⁶ .................................................. H02N 13/00
[52] U.S. Cl. ........................................ 361/234; 279/128
[58] Field of Search ......................... 361/230–235; 279/128

[56] References Cited

U.S. PATENT DOCUMENTS

| | | | |
|---|---|---|---|
| 4,384,918 | 5/1983 | Abe | 361/234 |
| 5,055,964 | 10/1991 | Logan et al. | 361/234 |
| 5,151,845 | 9/1992 | Watanabe et al. | 361/234 |
| 5,548,470 | 8/1996 | Husain et al. | 361/234 |
| 5,572,398 | 11/1996 | Federlin et al. | 361/234 |
| 5,612,850 | 3/1997 | Birang et al. | 361/234 |
| 5,671,119 | 9/1997 | Huang et al. | 361/234 |
| 5,675,471 | 10/1997 | Kotecki | 361/234 |
| 5,677,824 | 10/1997 | Harashima et al. | 361/234 |
| 5,699,223 | 12/1997 | Mashiro et al. | 361/234 |
| 5,781,400 | 7/1998 | Takahashi et al. | 361/234 |
| 5,793,192 | 8/1998 | Kubly et al. | 361/234 |
| 5,798,904 | 8/1998 | Guyot | 361/234 |

*Primary Examiner*—Fritz Fleming
*Attorney, Agent, or Firm*—Antonelli, Terry, Stout & Kraus, LLP

[57] ABSTRACT

An electrostatic chuck includes a pair of electrodes having different polarities; and a dielectric film, formed on top surfaces of the pair of electrodes, on which a sample is to be electrostatically attracted and held when a DC voltage is applied between the pair of electrodes; wherein the respective amounts of electric charges stored on attracting portions of the dielectric film corresponding to the pair of electrodes, directly before stopping supply of the DC voltage applied between the pair of electrodes, are substantially equal to each other. With this chuck, the electric charges stored on the attracting portions of the dielectric film after stopping supply of the DC voltage can be eliminated due to the balance between the electric charges having different polarities. The electrostatic chuck is subjected to a significantly reduced residual attracting force.

6 Claims, 16 Drawing Sheets

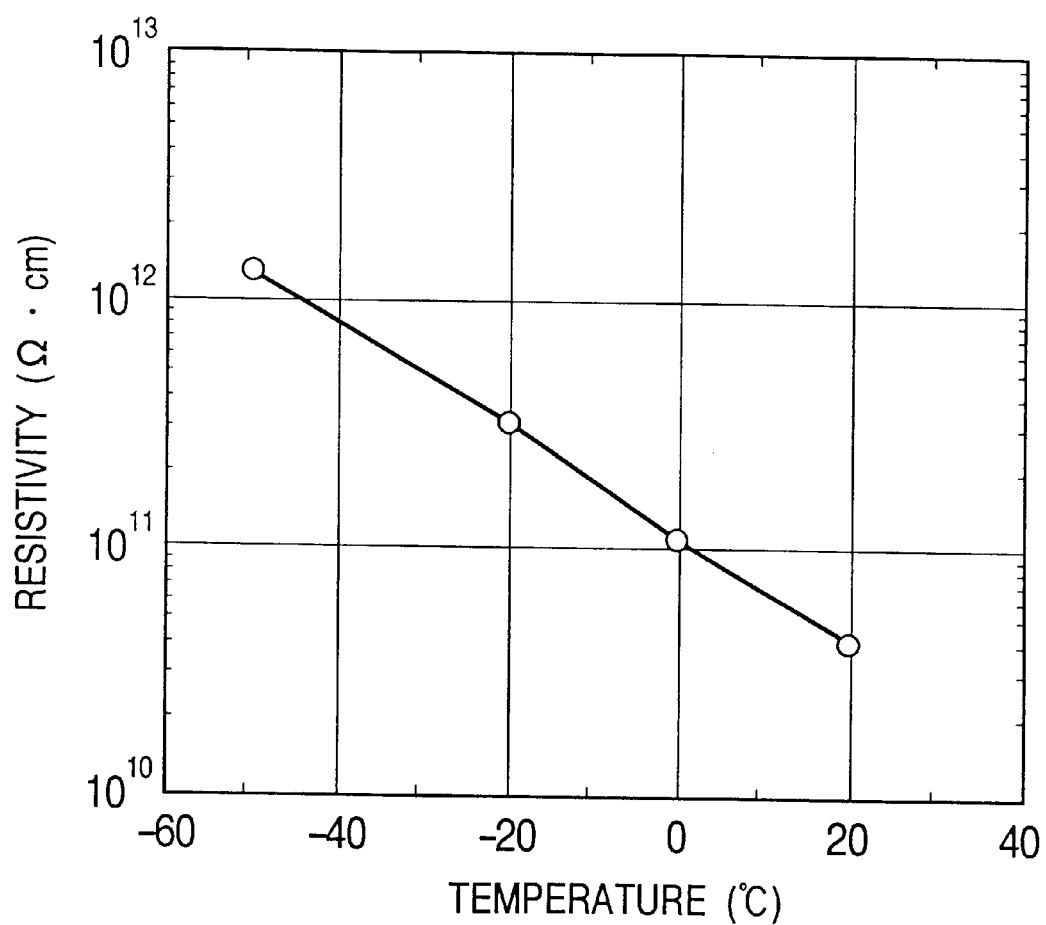

ELECTROSTATIC CHUCK, AND METHOD OF AND APPARATUS FOR PROCESSING SAMPLE

BACKGROUND OF THE INVENTION

The present invention relates to an electrostatic chuck, and a method of and an apparatus for processing a sample using the chuck. The invention relates particularly to an electrostatic chuck suitable for electrostatically holding a sheet-like sample, such as a semiconductor substrate or a liquid crystal substrate, when the sample is processed or carried, and a method of and an apparatus for processing a sample using the chuck.

An example of a bipolar type electrostatic chuck using a pair of electrodes having different polarities, in the form of an electrostatically attracting apparatus having a pair of semi-circular or concentrically-circular shaped flat electrodes, is disclosed in Japanese Patent Laid-open No. 64950/1982. According to this document, by increasing the ratio between the area of the electrostatically attracting apparatus and the electrode area of the pair of flat electrodes, mounting a substance on the pair of flat electrodes through an insulator having a thickness of 50 to 200 $\mu$m, and electrostatically attracting the substance by applying a voltage between the flat electrodes, it is possible to employ the electrostatically attracting apparatus to hold both a conductive substance and a conductive substance whose surface is covered with a thin insulating film to provide a stronger attracting force and to simplify the structure of the apparatus. The document also describes that the attracting force is maximized when the areas of the pair of positive and negative electrodes are equal to each to other. Also, another bipolar type electrostatic chuck is disclosed in Japanese Patent Laid-open No. 120329/1994.

The method of holding a sample, for example, a wafer using such an electrostatic chuck has advantages in that: (1) since the surface of a wafer to be processed is not mechanically contacted by the chuck, the wafer can be prevented from being contaminated by abrasive particles and the like; and (2) since the entire back surface of a wafer is fixedly attracted on the chuck, the camber of the wafer can be corrected, so that the contact of the wafer with an attracting surface of the chuck becomes more reliable when the wafer is finely processed by etching or the like, to improve the thermal conductivity of the wafer, thereby facilitating the temperature control of the wafer. For these reasons, the electrostatic chuck is being extensively used as a sample stage (referred to simply as an "electrode") of a dry etching apparatus or a plasma processing apparatus, such as a CVD apparatus.

A bipolar type electrostatic chuck used for a plasma processing apparatus, in the form of an electrostatically attracting apparatus, for example, in Japanese Patent Publication No. 44747/1982. The document indicates that a larger attracting force can be obtained during plasma discharge by making the area of the positive electrode larger than that of the negative electrode, and that the attracting force in the case of generation of no plasma is maximized when the ratio between the areas of the positive and negative electrodes is set at 1.

Another disadvantage of the electrostatic chuck will be described below. In general, to remove a wafer from the electrostatic chuck after termination of the processing of the wafer, bar-like supports (generally, called "pushers" or "lift pins") are lifted or pushed up from the interior of the electrostatic chuck for pushing up the wafer therefrom. The mechanism involving such bar-like supports is known, for example, from U.S. Pat. No. 4,565,601 or Japanese Patent Laid-open No. 252253/1994. However, in the case where there exists a residual attracting force between an electrostatic chuck and a wafer, if a wafer is forcibly peeled from the electrostatic chuck by applying a strong force against the residual attracting force, there arises a problem that the wafer may be cracked or undergo an abnormal discharge sufficiently large to destroy devices of the wafer.

To cope with the disadvantages due to a residual attracting force, various methods for eliminating an electric charge stored on an electrostatic chuck have been proposed. For example, a method of eliminating an electric charge stored on an electrostatic chuck upon removal of a sample from the chuck is described in U.S. Pat. No. 5,117,121, wherein a residual attracting force eliminating voltage, having a polarity reversed with respect to that of an attracting voltage and which is higher than the attracting voltage, is applied between the electrodes of the chuck. Another method of eliminating an electric charge stored on an electrostatic chuck is described in Japanese Patent Laid-open No. 185773/1983, wherein a DC voltage for generating an electrostatic attracting force is turned off, and thereafter the radio frequency power for generating a plasma is turned off. Besides these, various methods of removing a sample from an electrostatic chuck are described, for example, in Japanese Patent Laid-open Nos. 112745/1989 and 247639/1992.

SUMMARY OF THE INVENTION

The electrostatic chucks described in Japanese Patent Laid-open No. 64950/1982 and Japanese Patent Publication No. 4474/1982 have failed to examine the residual attracting force.

Namely, in the case where the temperature of a wafer as a sample is required to be controlled at a specific value during processing of the wafer, for example, at a plasma processing step, a heat transfer gas is supplied between the back surface of the wafer and the electrostatic chuck. For this purpose, the electrostatic chuck has a structure in which the wafer mounting surface of the chuck is provided with a dispersion groove (called "a gas groove") for uniformly supplying a heat transfer gas. An electrostatic chuck used for holding a wafer subjected to plasma processing is described, for example, in Japanese Patent Laid-open No. 86382/1995, wherein a wafer mounting surface of the chuck has a recess for reducing the contact area between the wafer mounting surface and the wafer, thereby suppressing adhesion of contaminants on the wafer. With respect to the dispersion groove or recess, various patterns have been developed. In the case where a groove or recess is provided in a wafer mounting surface of an electrostatic chuck as described above, the attracting areas on the positive and negative electrode sides change depending on the size and shape of the dispersion groove or recess, so that a residual attracting force is generated.

Further, even in the case where an electrostatic chuck is used during plasma processing the, the amounts of the electric charges stored on attracting surfaces on the positive electrode side and the negative electrode side are different from each other as a result of generation of a self-bias voltage due to the plasma and the application of a radio frequency bias, so that a residual attracting force is generated.

As a result, even the bipolar type electrostatic chuck requires a step of eliminating the electric charge stored on the chuck for removing a residual attracting force, so that there arises a problem in terms of lowering the throughput in carrying wafers. Another problem is that, since an electric charge remains in a dielectric film constituting an attracting surface of the electrostatic chuck, the attracting surface is liable to attract contaminants which in turn adhere on the back surface of a new sample attracted on the attracting surface. In particular, when a wafer is processed using a CVD apparatus which generates deposits having electric charges, such a problem becomes significant.

Further, the method of eliminating a residual attracting force, as described in U.S. Pat. No. 5,117,121, requires the step of eliminating an electric charge stored on the chuck by newly applying a reverse voltage. This causes a problem in terms of lowering the throughput in carrying a sample. Also, if the reverse voltage becomes excessively large, there arises another problem in that an electrostatic attracting force is produced again, to thereby generate a residual attracting force. Besides, in the method of eliminating a residual attracting force, as described in Japanese Patent Laid-open No. 185773/1983, since, after stopping of the supply of the DC voltage for electrostatic attraction, supply of the radio frequency power for generating a plasma is stopped, the time required for eliminating the electric charge must be made longer. This causes a problem in terms of lowering the throughput in carrying a wafer. In the case of supplying a heat transfer gas to the back surface of a sample simultaneously with electrostatic attraction, supply of the transfer gas is usually stopped upon stopping the supply of the DC voltage for electrostatic attraction. As a result, the temperature of the sample is increased and thereby plasma continuous to be produced, so that processing of the sample continues, thereby exerting an adverse effect on the sample, the processing of which should have been terminated.

Additionally, in a plasma processing apparatus, generally, a radio frequency voltage is applied to a sample stage for controlling an incident energy of ions in a plasma against the sample by means of a bias voltage generated at the sample stage. When such a plasma processing apparatus uses a bipolar type electrostatic chuck, it is difficult to equally apply the bias voltage to the sample resulting from the electrode structure of the chuck, as compared with the case of using a monopole type electrostatic chuck. This possibly exerts an adverse effect on uniform processing of the sample.

In view of the foregoing, the present invention has been made, and a first object of the present invention is to provide an electrostatic chuck which is capable of reducing a residual attracting force to a value in a substantially practically usable range.

To achieve the first object, according to the present invention, there is provided an electrostatic chuck including: a pair of electrodes having different polarities; and, a dielectric film formed on top surfaces of the pair of electrodes on which a sample is electrostatically attracted and held when a DC voltage is applied between the pair of electrodes; wherein the amounts of electric charges stored on attracting portions of the dielectric film corresponding to the pair of electrodes, directly before stopping the supply of the DC voltage applied between the pair of electrodes, are substantially equal to each other.

Another object of the present invention is to provide a sample processing method which is capable of reducing the standby time upon removal of a sample from an electrostatic chuck for improving the throughput.

To achieve the second object, according to the present invention, there is provided a sample processing method including the steps of: electrostatically attracting and holding a sample on an electrostatic chuck including a pair of electrodes having different polarities and a dielectric film formed on top surfaces of the pair of electrodes, by applying a DC voltage between the pair of electrodes; and processing the sample electrostatically attracted and held on the chuck through the dielectric film; wherein the amounts of electric charges stored on attracting portions of the dielectric film corresponding to the pair of electrodes, directly before stopping the supply of the DC voltage applied between the pair of electrodes after termination of processing the sample, are substantially equal to each other, so that the electric charges stored on the attracting portions of the dielectric film after stopping the supply of the DC voltage are eliminated due to the balance therebetween, whereby the sample can be removed from the sample mounting surface without addition of any special step.

A further object of the present invention is to provide a sample processing apparatus which is capable of reducing the stand-by time upon removal of a sample from an electrostatic chuck for improving the throughput.

To achieve the third object of the present invention, there is provided a sample processing apparatus for processing a sample electrostatically attracted and held on an electrostatic chuck, the electrostatic chuck including: a pair of electrodes having different polarities; and a dielectric film formed on top surfaces of the pair of electrodes on which a sample is electrostatically attracted and held when a DC voltage is applied between the pair of electrodes; wherein a recess which is not in contact with the back surface of the sample is formed in a surface of the dielectric film on which the sample is disposed; and the amounts of electric charges of different polarities stored on the attracting portions of the surface of the dielectric film, excluding the recess, are equal to each other.

BRIEF DESCRIPTION OF THE DRAWINGS

FIG. 17 is a graph showing a change in resistivity of a dielectric film of the electrostatic chuck shown in FIG. 14 depending on the temperature;

DESCRIPTION OF THE PREFERRED EMBODIMENTS

Figure 22:
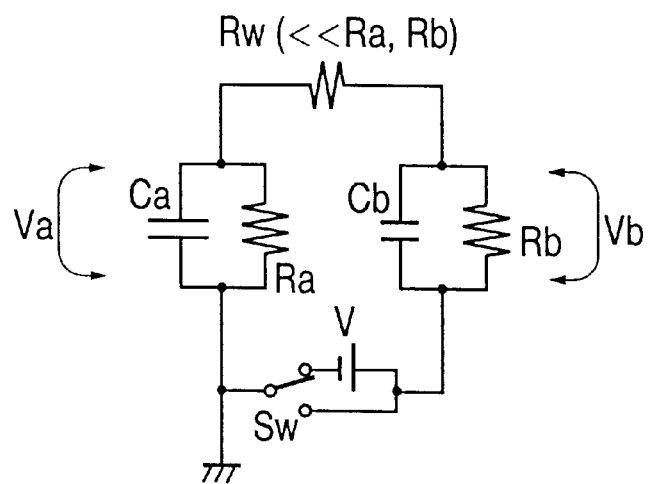
FIG. 22 is a circuit diagram showing an equivalent circuit of the electrostatic chuck.

Prior to description of the preferred embodiments, the cause for generation of a residual attracting force and the effect of the present invention will be described with reference to FIGS. 22 to 25. FIG. 22 shows a simple equivalent circuit of an electrostatic chuck in which the ratio between the areas of the actual attracting portions of two electrodes (for example, electrodes A and B) is set at 2.8, that is, electrode A side: electrode B side=2.8 (152.5 cm$^2$):1(54 cm$^2$). The equivalent circuit of the electrostatic chuck being actuated to attract a wafer will be briefly described. In the equivalent circuit shown in FIG. 22, a parallel circuit including an electrostatic capacity Ca of the electrode A and the resistance Ra of a dielectric film formed on the electrode A is connected in series to a parallel circuit including an electrostatic capacity Cb of the electrode B and the resistance Rb of a dielectric film formed on the electrode B through a resistance Rw (sufficiently smaller than each of Ra and Rb) of the wafer.

Letting Va, Vb be potential differences finally generated between the electrodes A and B and the wafer when a voltage of 400 V is applied between the electrodes A and B in such a state, the following equations are given in a stable state.

$$Va+Vb=400 \qquad (1)$$

$$Ra:Rb=Va:Vb \qquad (2)$$

Figure 23:
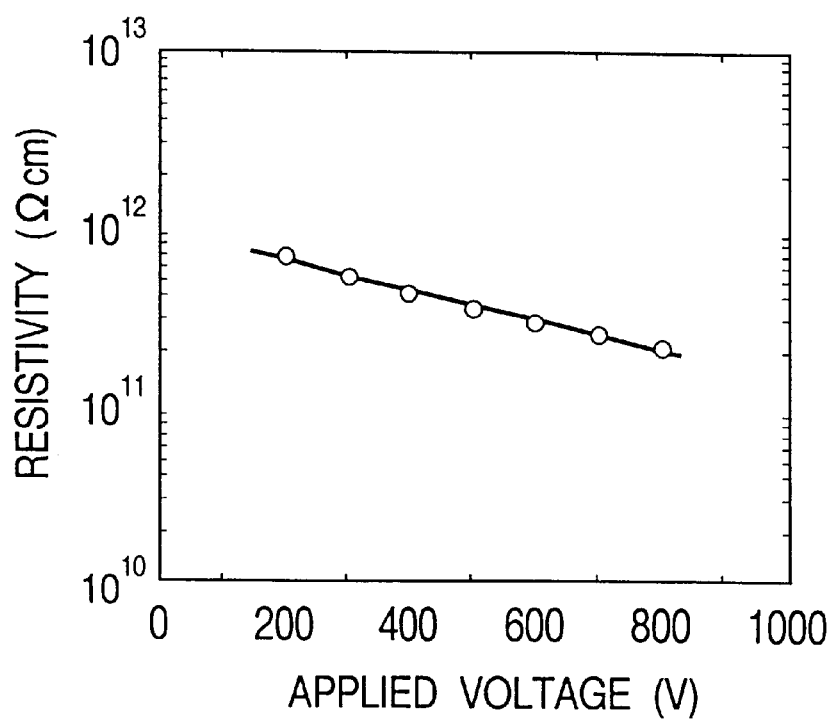
FIG. 23 is a graph showing a relationship between a volume resistivity of a ceramic material and an applied voltage.

In the case of using a dielectric film made from a ceramic material, however, the volume resistivity thereof is changed depending on the applied voltage, as shown in FIG. 23. Accordingly, letting V be the applied voltage, the volume resistivity of the dielectric film of the electrostatic chuck used for the present invention is expressed by the following equation:

$$\text{volume resistivity}=1\times10^{(11.953-0.000764\ V)} \qquad (3)$$

Since the resistance of the actual attracting portion of the dielectric film formed on each electrode can be calculated from the volume resistivity of the dielectric film, the potential difference between each electrode and the wafer can be obtained on the basis of the equations (1) to (3). In this example, the potential difference Va between the electrode A and the wafer is 126 V, and the potential difference Vb between the electrode B and the wafer is 274 V. Incidentally, as for the dielectric film, the electrostatic capacity is obtained by dividing the product of the dielectric constant and the area by the thickness. Here, assuming that the relative dielectric constant of the ceramic forming the dielectric film is 5, the electrostatic capacity of the dielectric film is determined. Thus, the amount of an electric charge stored on the dielectric film can be calculated on the basis of the electrostatic capacity of the dielectric film thus determined and the potential difference on the dielectric film obtained using the equations (1) to (3). In actual operation, however, there exists a space represented by a surface roughness between the wafer and the dielectric film. Such a space may be regarded as substantially a vacuum space as in a vacuum chamber even if there exists a heat transfer gas. Now, in this example, assuming that the space distance is about 3 μm and the thickness of the dielectric film is 300 μm, the space distance is one-hundredth of the thickness of the dielectric film. As a result, even if the dielectric constant of the space is one-fifth of that of the dielectric film, the electrostatic capacity of the space becomes about 20 times that of the dielectric film. For this reason, the electrostatic capacity of the space is used in place of that of the dielectric film for the above-described calculation. The results thus calculated are summarized as follows: namely, the electrode A has an area of 152.5 cm$^2$, a capacity of 46 nF, a potential difference with the wafer of 126 V, and an amount of electric charge of 5.8×10$^{-6}$ coulomb [C]; and the electrode B has an area of 54 cm2, capacity of 16 nF, potential difference with wafer of 274 V and an amount of electric charge of 4.4×10$^{-6}$ coulomb [C]. From these results, it becomes apparent that there is a difference between the amounts of the electric charges stored on the actual attracting portions on the electrodes A and B.

Figure 24A:
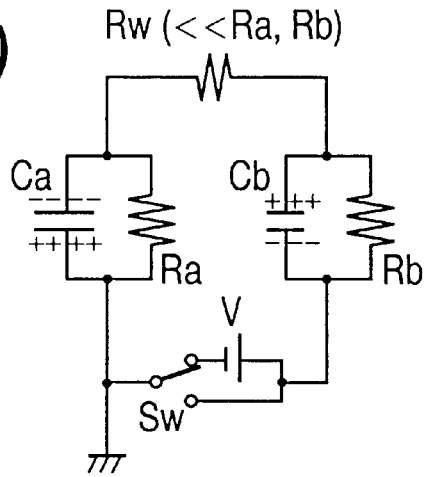
FIGS. 24(a) to 24(c) are circuit diagrams each showing an attracting action and an electric charge eliminating action in the equivalent circuit shown in FIG. 22.
Figure 24B:
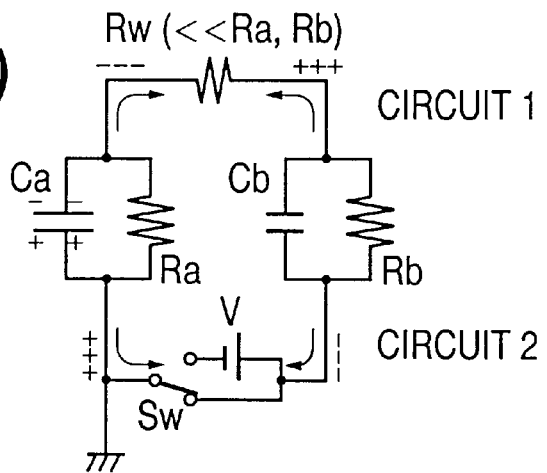
Figure 24C:
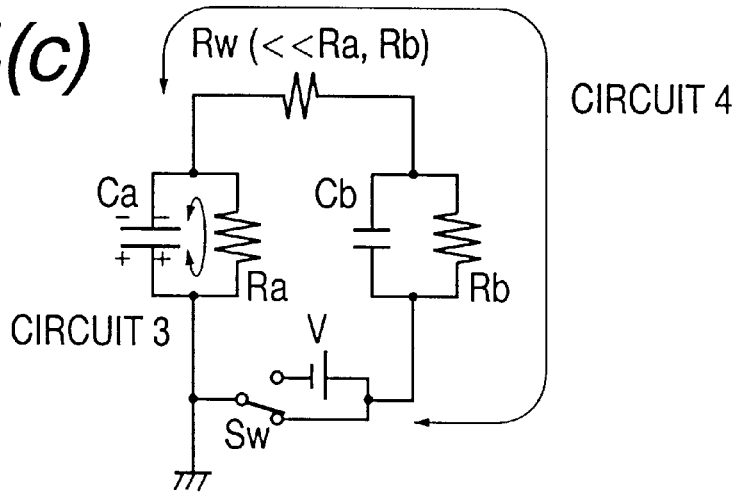

FIGS. 24(a) to 24(c) are typical circuit diagrams showing changes in the amounts of the electric charges stored in capacitance components when a DC power supply is turned off from an attracting state. In the attracting state shown in FIG. 24(a), electric charges are unequally stored on the dielectric film formed on electrodes A and B in large amounts. When the application of a DC voltage is stopped, the electric charge stored on the dielectric film formed on the electrode B is quickly eliminated by way of circuits 1 and 2 because the resistance of the wafer is sufficiently smaller than the resistance of the dielectric film, as shown in FIG. 24(b). Besides, the electric charge remaining on the dielectric film on the electrode A is eliminated by way of the circuit 3 or 4 as shown in FIG. 24(c); however, the elimination of the electric charge takes a long time because the circuit 3 or 4 has a large value of resistance Ra or Rb, that is, it has a large discharge time constant. Such a remaining electric charge becomes the cause for generation of a residual attracting force.

On the other hand, in the case where the ratio between areas of the actual attracting portions of a dielectric film on the two electrodes is 1:1, as in the embodiment of the present invention, since the attracting portions of the dielectric film on the two electrodes have the same resistance and also have the same potential difference with the wafer, the electric charges stored on the attracting portions are equal to each other. Accordingly, when the application of a DC voltage is stopped, the electric charges on the attracting portions are eliminated only by way of the circuits 1 and 2 shown in FIG. 24(b), so that it takes a short time to eliminate the electric charges and thereby no residual attracting force remains on the attracting portions.

Figure 25:
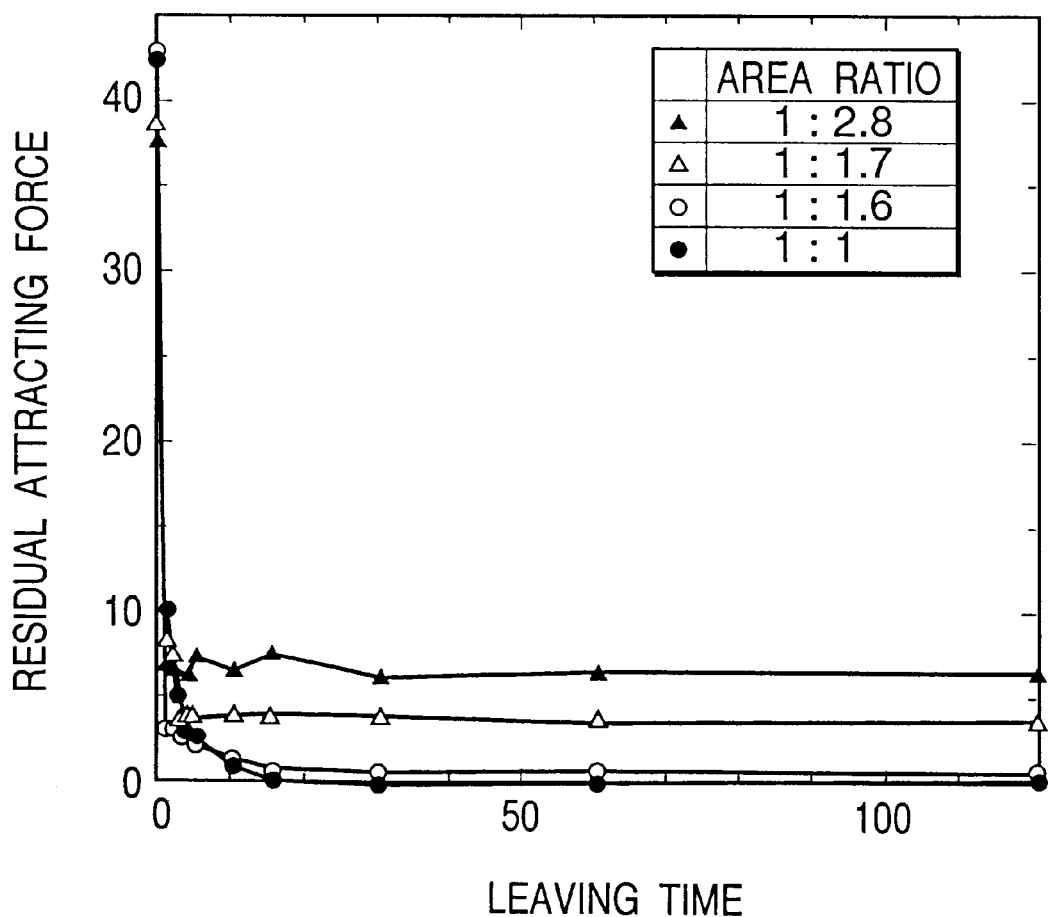
FIG. 25 is a graph showing a relationship between a residual attracting force and a leaving time using an attracting area ratio as a parameter.

FIG. 25 is a graph showing residual attracting force generating states when the ratio between areas of the attracting portions of a dielectric film formed on two electrodes is changed. In this figure, the abscissa indicates the time elapsed after cutting off the DC power supply, and the ordinate indicates the residual attracting force. From the results shown in FIG. 25, it is revealed that the residual attracting force is not generated when the area ratio between the actual attracting portions on the two electrodes is 1:1; however, it becomes larger with increase in the area ratio.

Accordingly, in an electrostatic chuck having a configuration wherein the ratio between the areas of the wafer attracting portions of a dielectric film formed on two electrodes is 1:1, as in this example, little residual attracting force is generated and it takes a short time to eliminate the electric charges stored on the wafer attracting portions. A sample processing apparatus including such an electrostatic chuck is also advantageous in improving the throughput of the apparatus and preventing a wafer from being broken when the wafer is pushed up by lift pins or the like after termination of the processing of the wafer.

Hereinafter, a first embodiment of the present invention will be described with reference to FIGS. 1 to 8.

Figure 1:
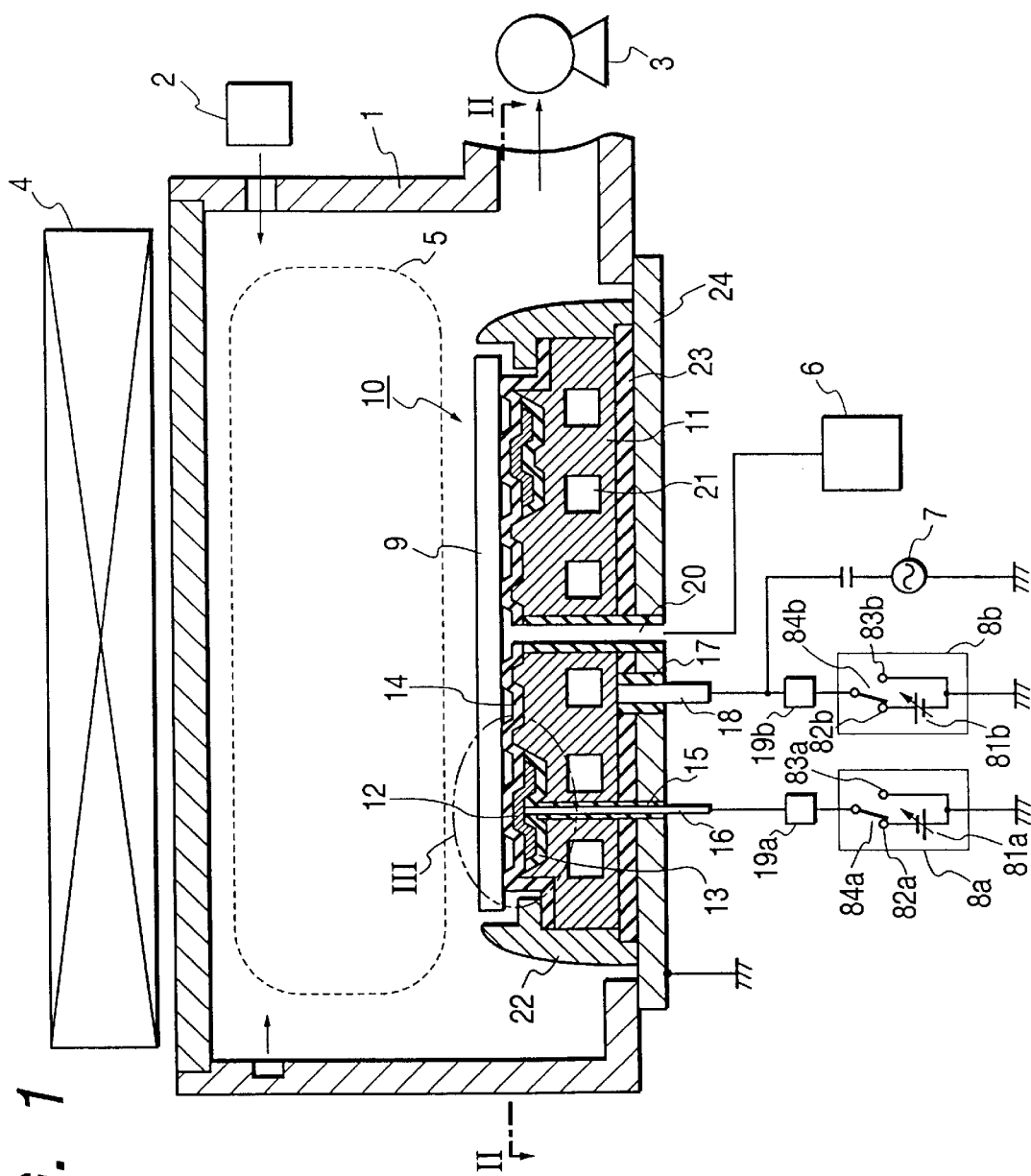
FIG. 1 is a vertical sectional view of one example of a sample processing apparatus using an electrostatic chuck, representing a first embodiment of the present invention.

FIG. 1 shows one example of a sample processing apparatus using an electrostatic chuck, representing a first embodiment of the present invention. The sample processing apparatus is represented by an etching apparatus, a processing apparatus using plasma, such as a film formation apparatus, or a vacuum processing apparatus not using plasma, such as an ion injection apparatus. In this embodiment, description will be made by way of example with reference to a plasma processing apparatus.

Referring to FIG. 1, there is shown a vacuum chamber 1 to which a gas supply unit 2 and an evacuation unit 3 are connected. The vacuum chamber 1 is provided with a plasma generating unit 4 for generating a plasma 5 in the vacuum chamber 1. In the vacuum chamber 1, there is provided a sample stage on which a sample to be processed by the plasma 5, for example, a substrate 9, such as a semiconductor substrate (or wafer) or a liquid crystal substrate, is mounted. The sample stage comprises an electrostatic chuck 10.

The electrostatic chuck 10 is composed of an inner electrode 11, a ring electrode 12, an insulating film 13, and an insulating film (or dielectric film) 14 for electrostatic attraction. A coolant passage 21 is formed in the electrode 11. A ring-shaped recess in which the electrode 12 is to be formed, is formed in the top surface of the electrode 11. The electrode 12 is formed into a ring-shape. The electrode 11 is made from a conductive material, such as an aluminum alloy. In the recess formed in the top surface of the electrode 11, there is provided the electrode 12 supported on the insulating film 13. The insulating film 13 is formed from alumina by thermal spraying, and the electrode 12 is formed from tungsten by thermal spraying. The insulating film 13 is interposed between the electrodes 11 and 12 for directly insulating the electrodes 11 and 12 from each other. On the surfaces of the electrodes 11 and 12, there is formed the insulating film 14 for electrostatic attraction. The insulating film 14 is formed from alumina by thermal spraying. In addition, the insulating film 13 is made from a material having a resistance higher than that of the insulating film 14 for electrostatic attraction. This is because an electric circuit for electrostatic attraction is formed through the insulating film 14.

A lead wire 18 is connected to the inner electrode 11 for applying a voltage thereto, and a lead wire 16 is connected to the ring electrode 12 for applying a voltage thereto. The lead wire 16 is connected to the ring electrode 12 by way of a through-hole formed of an insulating sleeve 15 in the inner electrode 11. The lead wire 16 is electrically insulated from the inner electrode 11 by the insulating sleeve 15. The lead wires 16 and 18 are connected through low pass filters 19a and 19b to power supplies 8a and 8b for electrostatic attraction, respectively. A negative voltage is applied from the DC power supply 8a to the ring electrode 12, and a positive voltage, which has the same absolute value as that of the negative voltage applied to the ring electrode 12, is applied from the DC power supply 8b to the inner electrode 11. The electrodes 11 and 12 can be grounded by turning terminals 82a and 82b to terminals 83a and 83b using switches 84a and 84b, respectively. The inner electrode 11 and the ring electrode 12 are electrically insulated from the substrate 9 by the insulating film 14 for electrostatic attraction. Accordingly, by applying positive and negative voltages from the power supplies 8a and 8b to the inner electrode 11 and the ring electrode 12, respectively, a DC circuit is formed through the substrate 9 and thereby electric charges are stored, so that the substrate 9 can be electrostatically attracted to the top surfaces of the electrodes 11 and 12.

Figure 3:
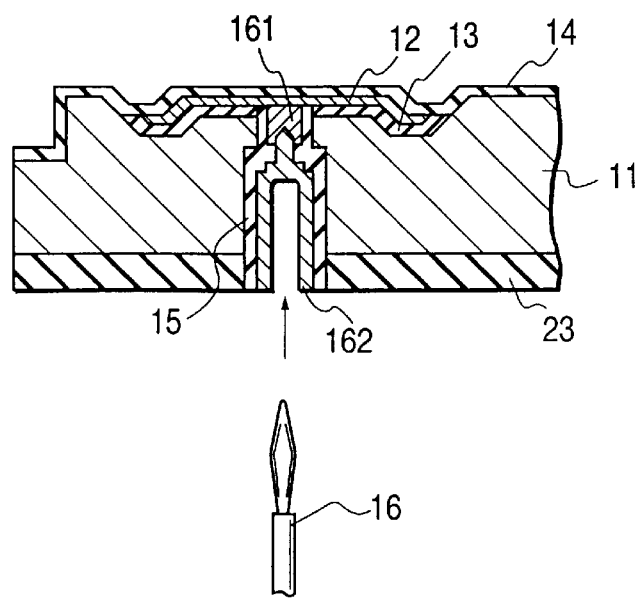
FIG. 3 is a sectional view showing the details of a portion III of FIG. 1.

For connection of the lead wire 16 to the ring electrode 12, as shown in FIG. 3, a flange is provided on the upper portion of the insulating sleeve 15, and an electrode core 161 is provided in the upper space of the flange while a socket 162 is provided in the lower space of the flange. The socket 162 is fixed to the flange by being screwed in the electrode core 161. The lead wire 16 is inserted in the socket 162 to be thus connected thereto. The ring electrode 12 is formed by thermal spraying in a state wherein the electrode core 161 is fixed in the flange of the insulating sleeve 15. Thus, the electrode core 161 can be easily connected to the ring electrode 12. Here, the electrode core 161 is made from the same material, i.e. tungsten, as that of the ring electrode 12 so as to ensure proper connection with the ring electrode 12. In addition, the lead wire 18 can be easily connected to the inner electrode 11 by a method wherein a female thread portion (not shown) is formed in the inner electrode 11 and a male thread portion is formed at the leading end portion of the lead wire 18, whereby the male thread portion of the lead wire 18 is screwed in the female thread portion of the inner electrode 11.

A central portion of the inner electrode 11 is pierced to form a through-hole 20 in which an insulating sleeve is provided. The through-hole 20 is used for introducing a heat transfer gas from a source 6 to the back surface of the substrate electrostatically attracted on the electrostatic chuck 10. Here, the insulating film 14 for electrostatic attraction is formed by thermal spraying and is finally finished by polishing into a flat shape having a specific thickness. The use of the insulating film 14 formed by thermal spraying allows a groove to be easily formed in the surface of the inner electrode 11 or ring electrode 12 after formation of the insulating film 14 by previously machining the surface of the electrode 11 or 12 to form a recess (not shown). This facilitates an electrode design to provide a gas dispersion groove in the surface of the electrode.

Figure 2:
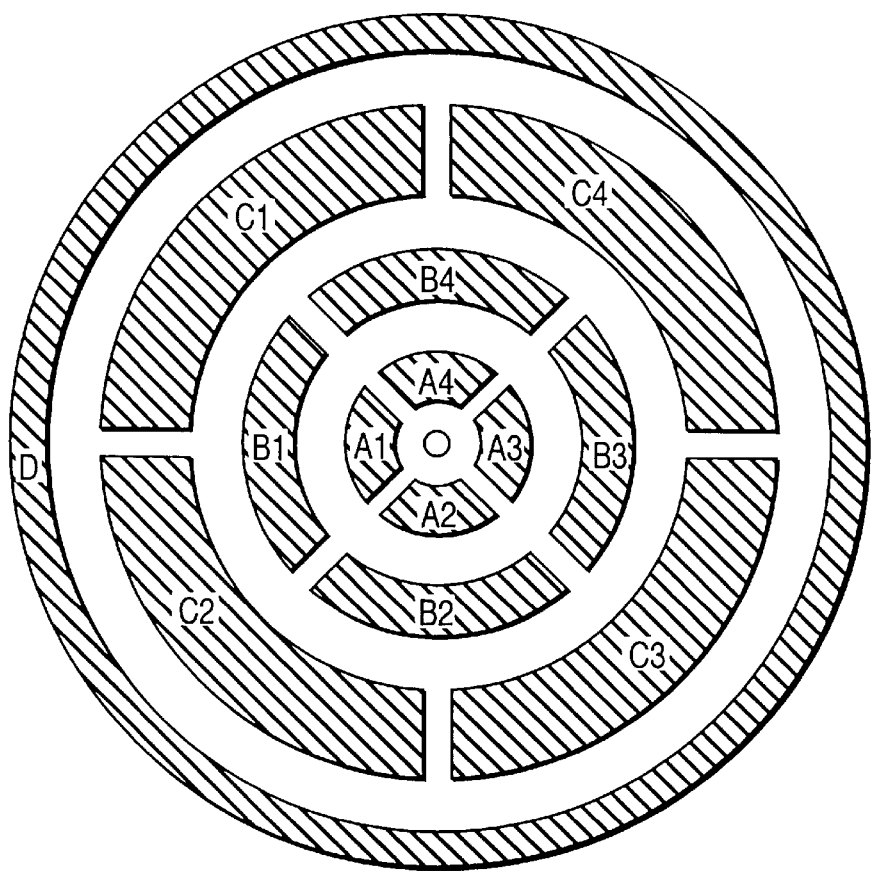
FIG. 2 is a sectional view taken on line II—II of FIG. 1, showing the electrostatic chuck.

The gas dispersion groove (or gas groove) is provided in the surface of the electrode for supplying a heat transfer gas (for example, helium gas) to the back surface of a substrate to be processed thereby controlling the temperature of the substrate or adjusting a heat transfer characteristic for making the substrate temperature distribution more uniform. Here, as shown in FIG. 2, there is provided a gas dispersion groove composed of a plurality of circumferentially extending groove components partially connected to each other in the radial direction. The gas dispersion groove has a depth of 0.3 mm.

An attracting surface of the insulating film 14, which has no dispersion groove and is brought in direct-contact with the substrate 9, has attracting surfaces A1 to A4, B1 to B4, and D corresponding to the inner electrode 11; and attracting surfaces C1 to C4 corresponding to the ring electrode 12. The area relationship of these attracting surfaces is set such that the total area of the attracting surfaces A1 to A4, B1 to B4, and D is equal to the total area of the attracting surfaces C1 to C4.

The insulating film 13, ring electrode 12, and insulating film 14 are formed by thermal spraying to thicknesses of 0.3 mm, 0.1 mm, and 0.4 mm, respectively. The contact surface of the insulating film 14 with the substrate 9 is polished to a thickness of 0.3 mn. The total thickness of the films formed on the inner electrode 11 by thermal spraying is 0.8 mm or less. That is, while the total thickness of the films formed on the inner electrode 11 by thermal spraying is maximized at a portion of the ring electrode 12, even such a maximized total thickness is very thin, such as 0.8 mm. Accordingly, the presence of the insulating films exerts only a negligible effect on application of a radio frequency voltage to the entire inner electrode 11, and thereby it does not affect processing of the substrate 9.

The electrostatic chuck 10 is mounted on the bottom surface of the vacuum chamber 1 through a grounding plate 24. The inner electrode 11 is mounted on the grounding plate 24 through an insulating plate 23. To prevent leakage of the heat transfer gas from the through-hole 20 provided in the central portion of the inner electrode 11 when the heat transfer gas is supplied into the through-hole 20, contact portions with the through-hole 20 are sealed. The inner electrode 11, insulating plate 23, and grounding plate 24 are fastened to each other with bolts (not shown).

A cover 22 is provided around the outer surface of the inner electrode 11 in such a manner that the outer peripheral portion thereof is smoothly tilted inward in the upward direction. When ions in a plasma are irradiated from top to bottom, the cover 22 formed into such a shape has no shady portion, so that reaction products, if deposited on the cover 22 during plasma etching, can be easily removed by exposing the cover 22 to a cleaning plasma. As a result, it is possible to easily reduce contaminants.

A radio frequency power supply 7, as well as the power supply 8b for electrostatic attraction, is connected to the inner electrode 11. The radio frequency power supply 7 is provided for applying a radio frequency bias voltage to the inner electrode 11. To prevent occurrence of abnormal discharge between the inner electrode 11 and the grounding plate 24, the diameter of the insulating plate 23 is set to be larger than that of the inner electrode 11 and to be smaller than that of the grounding plate 24 for preventing the inner electrode 11 from directly facing the grounding plate 24. With this configuration, it is not required to provide a separate insulating member around the outer surface of the inner electrode 11. That is, the cover 22 can serve as such an insulating member.

The temperature of the substrate 9 shown in FIG. 1 is controlled on the basis of the temperature of a coolant flowing in the coolant passage 21 provided in the inner electrode 11. Specifically, the temperature of the inner electrode 11 is controlled on the basis of the temperature of the coolant, and then the temperature of the substrate 9 is controlled by heat transfer from the cooled inner electrode 11 through the insulating film 14 and by the heat transfer gas supplied on the back surface of the substrate 9. In this embodiment, although the coolant passage 21 is provided only in the inner electrode 11, the temperature of the ring electrode 12 is also controlled by heat transfer from the inner electrode 11 through the thin insulating film 13. Accordingly, the coolant is not required to be supplied to the ring electrode 12, that is, it its sufficient for cooling the electrode 11 and 12 to provide the coolant passage 21 only in the inner electrode 11, thereby simplifying the cooling mechanism.

In the plasma processing apparatus having the above configuration, a negative voltage is applied to the ring electrode 12, and a positive voltage, which has the same absolute value as that of the voltage applied to the ring electrode 12, is applied to the inner electrode 11. With such application of positive and negative voltages to the electrodes 11 and 12, the electrode potentials shown in FIG. 4 are obtained.

Figure 4:
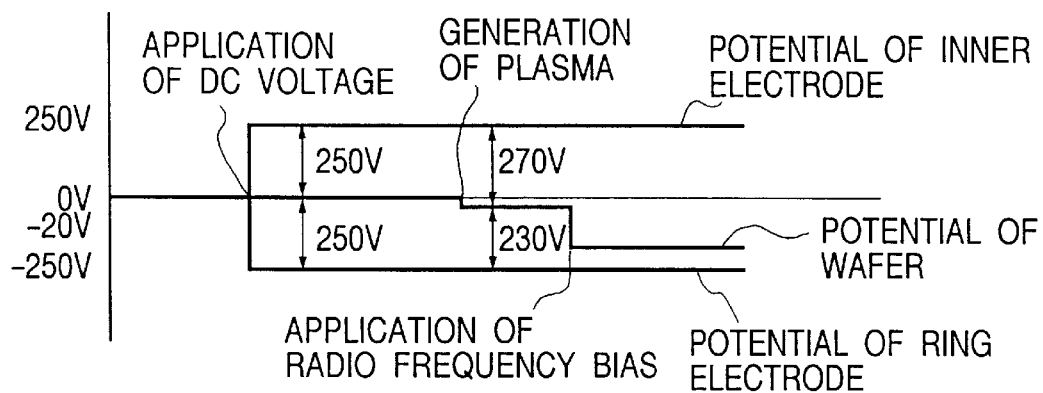
FIG. 4 is a timing diagram showing potentials of a wafer and electrodes of the electrostatic chuck shown in FIG. 1.

FIG. 4 shows potentials of a substrate and electrodes of an electrostatic chuck when the substrate electrostatically attracted on the chuck is exposed to a plasma. In the state shown in the figure, the plasma is generated by a power supplying means provided separately from power supplies for applying voltages to the electrodes of the electrostatic chuck. Specifically, in the example shown in FIG. 4, there are shown potentials of the substrate 9, ring electrode 12, and inner electrode 11 in a state wherein the substrate 9 is electrostatically attracted on the electrostatic chuck in a condition where a voltage of −250 V is applied to the ring electrode 12 and a voltage of +250 V is applied to the inner electrode 11. In the electrostatic chuck thus connected to the DC power supplies, the potential of the substrate 9 (wafer) attracted on the chuck is 0 V. Accordingly, even if the potential of the wafer is changed from 0 V to about −20 V by generation of a plasma, there occurs only a small change in potential difference between the wafer and each electrode. As a result, the change in electric charge stored between the wafer and each electrode is also small.

In the electrostatic chuck according to this embodiment, in which the attracting areas corresponding to the positive and negative electrodes are equal to each other and the power supplies are connected to the chuck such that DC voltages different in polarity and equal in absolute value are applied to the electrodes for electrostatic attraction, the residual attracting force of the chuck in a state where only a plasma is generated is very small. As a result, the effect of the residual attracting force on removal of the wafer from the electrostatic chuck is substantially negligible. Also, as the DC voltages are continued to be applied from the power supplies for electrostatic attraction after plasma extinction, the potential of the wafer is returned to the original state with no generation of plasma. Thus, the potential difference between the wafer and each electrode becomes zero. As a result, in the electrostatic chuck having attracting areas equal to each other, the amounts of electric charges stored on the attracting areas are equal to each other in accordance with the principle described with reference to FIGS. 22 to 25, and so electric charges remaining on the attracting areas corresponding to the electrodes are eliminated when the DC power supplies are turned off. In ether words, the electrostatic chuck in this embodiment has an effect of eliminating generation of a residual attracting force.

On the other hand, in some cases, to promote processing of a substrate, a radio frequency voltage is applied to a sample stage for generating a bias potential (generally, about −300 V or less) at the substrate. In this case, as shown in FIG. 4, the potential differences between the substrate and the electrodes are changed, so that there occurs a large difference between the amounts of electric charges stored on the attracting areas corresponding to the electrodes. Even in this case, however, a residual attracting force can be reduced to zero by applying DC voltages to the electrodes for a specific time after plasma extinction. Further, by stopping application of the radio frequency voltage during generation of plasma and then maintaining generation of plasma for a specific time, the potential difference between the wafer and each electrode can be reduced to that in the above-described plasma generation state without application of the radio frequency voltage, that is, to a value within the negligible range of about −20 V or less. In this state in which the potential difference between the wafer and each electrode is about 40 V, the attracting force is significantly small, and accordingly, when being pushed up using lift pins, the substrate is not cracked. Consequently, with elimination of a residual attracting force in the case where a radio frequency voltage is applied to a sample stage to promote processing a wafer, the residual attracting force can be effectively eliminated by adjusting the time from the stopping of supply of the radio frequency voltage to plasma extinction and a time from plasma extinction to the stopping of supply of the DC voltages for electrostatic attraction.

In addition, when a radio frequency voltage is applied as shown in FIG. 4, the potential difference between the wafer and the inner electrode (positive electrode) is made larger and the potential difference between the wafer and the ring electrode (negative electrode) is made smaller. In the electrode configuration of this embodiment, since the inner electrode forming the attracting components positioned at the outer peripheral portion and the central portion of the electrostatic chuck is provided as a positive electrode, the electrostatic chuck can strongly hold the outer peripheral portion and the central portion of the wafer. This is effective to more preferably suppress leakage of the heat transfer gas from the outer peripheral portion of the wafer during plasma processing. Further, such an electrode configuration is effective to cool the central portion of the wafer more strongly because the central portion of the wafer is strongly attracted on the chuck. In the case where the central portion of the wafer is not intended to be strongly cooled, the heat transfer efficiency at the gas groove portion corresponding to the central portion of the wafer is improved by enlarging the area and depth of the gas groove portion. In this case, with respect to the attracting portion corresponding to the ring electrode 12, the area thereof is made smaller and also the depth of the gas groove portion is made smaller, as compared with the attracting portion of the inner electrode 11.

Next, a procedure of attracting a substrate, starting plasma processing, terminating plasma processing, and eliminating electric charges in the substrate will be described in this order with reference to a time chart shown in FIG. 5. First, a substrate is carried into the vacuum chamber 1 by a carrier (not shown). After the substrate is placed on the electrostatic chuck 10, a DC voltage is applied between the positive and negative electrodes 11 and 12 for attracting the substrate, and then a heat transfer gas is introduced in the gas groove provided in the surface of the insulating film (dielectric film) 14. At this time, a processing gas for processing the substrate has been already introduced into the vacuum chamber 1 by the gas supply unit 2 and kept at a specific pressure. Then, energy (for example, microwave electric field, radio frequency electric field or the like) for generation of a plasma is introduced into the vacuum chamber 1 by the plasma generating unit 4. A plasma is thus generated in the vacuum chamber 1. Next, a radio frequency voltage for generating a bias voltage at the substrate is applied. It is to be noted that the necessity of applying a radio frequency voltage is dependent on the process used, and that in the case of applying a radio frequency voltage, application and stopping of the radio frequency voltage is performed during stable generation of plasma for matching of impedance. The plasma extinction is performed by stopping introduction of the energy for generating the plasma, simultaneously with termination of the plasma processing the wafer. In addition, supply of the radio frequency voltage is stopped before plasma extinction. Here, plasma extinction is performed after an elapse of four seconds following stopping of the radio frequency voltage. This eliminates, as described above, an unbalance between electric charges stored on attracting portions of the insulating film (dielectric film) formed on the electrodes 11 and 12 during plasma processing. After termination of the processing of the substrate, the supply of the heat transfer gas, which becomes unnecessary, is stopped and the heat transfer gas remaining in a dispersion groove and a gas supply passage (both, not shown) is exhausted. Then, the wafer is removed from the electrostatic chuck and carried; however, prior to removal of the wafer, the processing gas, which is usually composed of a harmful gas, must be sufficiently exhausted. In this embodiment, the exhausting of the processing gas is performed for about ten seconds, and elimination of electric charges (residual attracting force) stored on the electrostatic chuck is terminated during the time required for the exhausting of the processing gas. Specifically, introduction of the heat transfer gas and the processing gas is stopped after an elapse of one second following plasma extinction, and an exhausting of the heat transfer gas remaining in the dispersion groove is performed for 0.5 second. After that, the supply of the DC voltage for electrostatic attraction is terminated after an elapse of three seconds following plasma extinction. This operation of maintaining the supply of the DC voltage for three seconds after plasma extinction, as described above, reduces the unbalance between the electric charges stored on the attracting portions of the insulating film (dielectric film) on the electrodes 11 and 12, except for the unbalance between the electric charges which have been eliminated by maintaining generation of the plasma after stopping of the radio frequency voltage. Thus, since the amounts of the electric charges on both the electrodes are balanced, the electric charges polarized on both the electrodes are quickly extinguished for about two or three seconds after stopping the DC voltage. Consequently, the substrate can be carried directly after termination of the exhausting of the processing gas. After carrying the substrate from the vacuum chamber, a new substrate to be processed is carried into and processed in the vacuum chamber in the same manner as described above. Such a cycle will be repeated. And, if there is no substrate to be processed, the processing is terminated.

In this way, the final elimination of electric charges stored on the electrostatic chuck can be terminated during the time required for exhausting the processing gas, and consequently, it is not required to set a special time required for eliminating electric charges stored on the chuck. This is effective to improve the working ratio of the apparatus.

Figure 5:
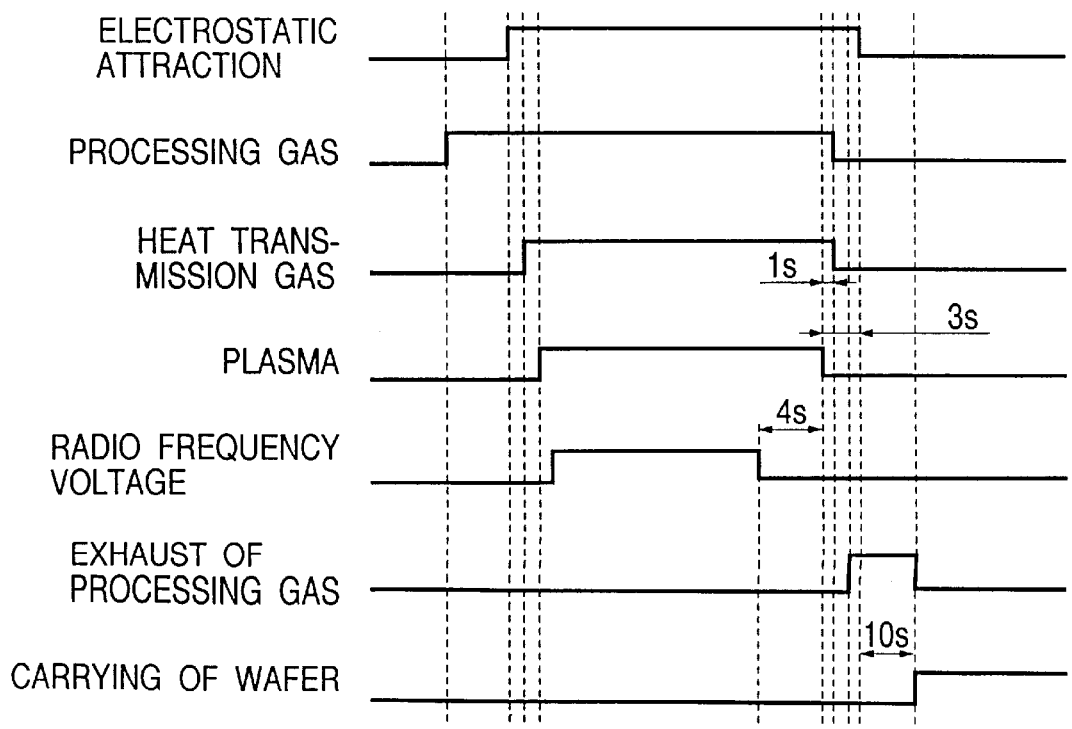
FIG. 5 is a time chart showing steps of attracting a wafer, processing the wafer, and eliminating electric charges in the case of processing using the apparatus shown in FIG. 1.
Figure 6:
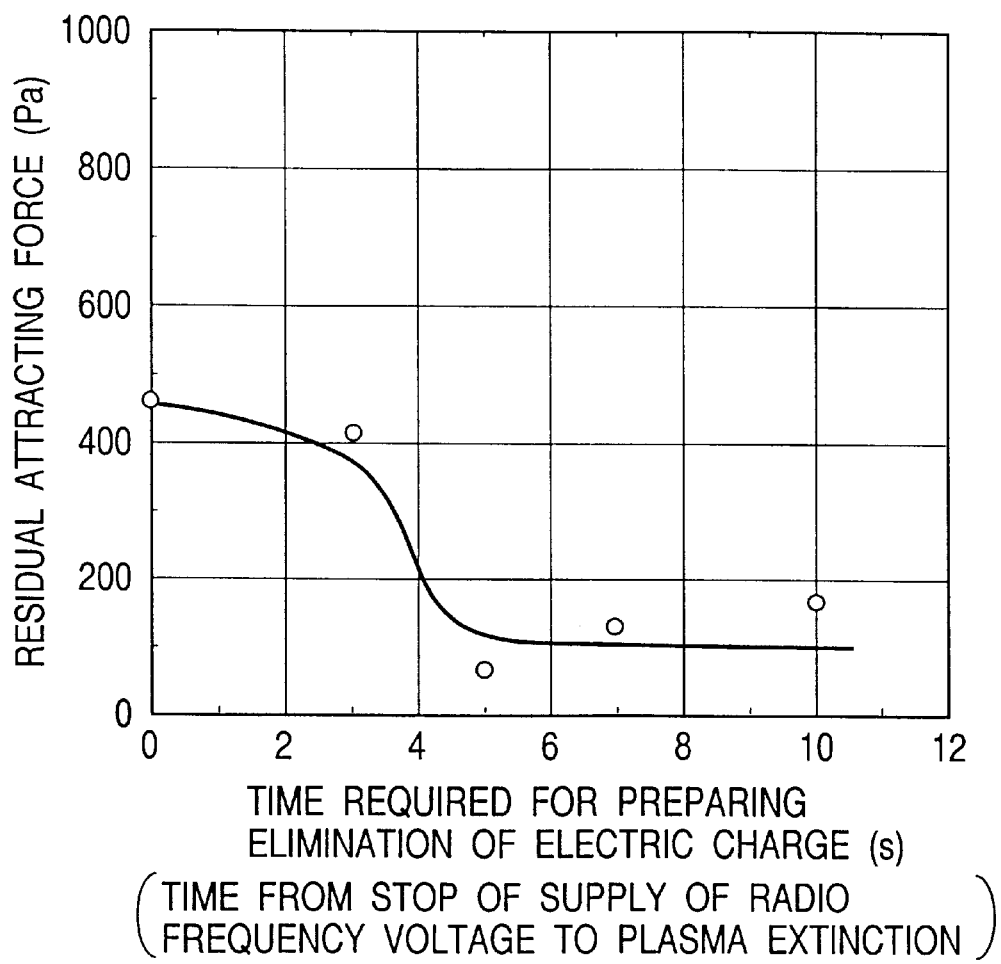
FIG. 6 is a graph showing a relationship between a residual attracting force and a time elapsing from the stopping of supply of a radio frequency voltage to plasma extinction in the case of processing using the apparatus shown in FIG.

While in the time chart shown in FIG. 5, the time from the stopping of supply of a radio frequency voltage to plasma extinction is set at four seconds, it may be suitably set depending on the time required for eliminating a residual attracting force (or eliminating an imbalance between electric charges on both electrodes) after stopping of the plasma. FIG. 6 shows a relationship between a residual attracting force and a time from the stopping of supply of a radio frequency voltage to plasma extinction. From data shown in FIG. 6, it is revealed that the residual attracting force is not reduced so much in the case where plasma extinction is performed until an elapse of about three seconds following the stopping of supply of the radio frequency voltage; it is reduced to about a half the original value in the case where plasma extinction is performed after an elapse of about four seconds following the stopping of supply of the radio frequency voltage; and it is reduced to a low and substantially constant value in the case where plasma extinction is performed after elapse of about five seconds following the stopping of supply of the radio frequency voltage. The above low residual attracting force after elapse of five seconds is due to the potential differences generated in the case where only the plasma is applied without applying the radio frequency voltage. Accordingly, as described above, there is no problem even when the substrate is removed from the electrostatic chuck in the state where a low residual attracting force remains.

Figure 7:
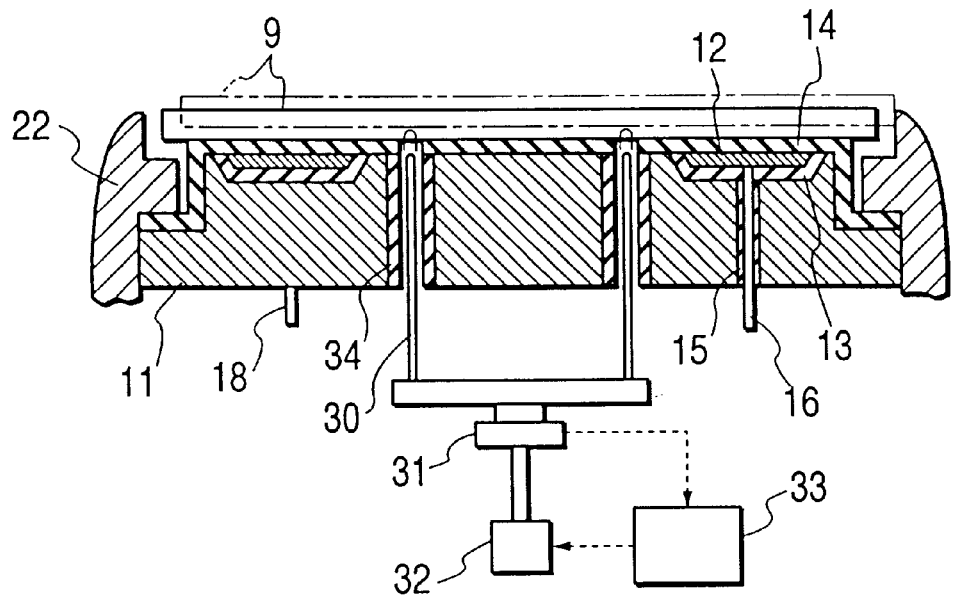
FIG. 7 is a vertical sectional view of the electrostatic chuck portion shown in FIG. 1.

Next, a manner of removing a substrate from the electrostatic chuck will be described with reference to FIGS. 7 and 8. Insulating sleeves 34 are provided in the inner electrode 11 at a plurality of positions. A lift pin 30 for removing the substrate 9 from the mounting surface of the electrostatic chuck is provided in each of the insulating sleeves 34 in such a manner as to pass through the insulating sleeve 34. A stepping motor 32 is mounted on the lower portions of the lift pins 30 through a load cell 31. A signal from the load cell 31 is inputted into a control unit 33. The control unit 33 outputs a signal for controlling the stepping motor 32. A cover 22 is provided in such a manner as to surround the outer peripheral portion of the electrode 11 and the outer peripheral portion of the substrate 9 in a state in which the substrate 9 is mounted on the insulating film 14 of the electrostatic chuck. Here, a gap between the outer peripheral end surface of the substrate 9 and the cover 22 is within an allowable range of about 1 mm or less. The allowable range of the above gap is set to allow the substrate 9 to be carried to a carrier (not shown) with no problem even when the substrate 9 is offset on the lift pins 30 when removed from the electrostatic chuck using the lift pins 30. With this configuration of the sample stage, even when a residual attracting force remains somewhat, the substrate 9 can be forcibly removed from the electrostatic chuck by the lift pins 30. Specifically, even in the case where the substrate 9 is subjected to a force greater than the residual attracting force when the lift pins are lifted, and tends to jump, the position of the substrate 9 is held by the cover 22. This makes it possible to remove the substrate 9 with safety even in the case where the residual attracting force is not perfectly eliminated.

Figure 8:
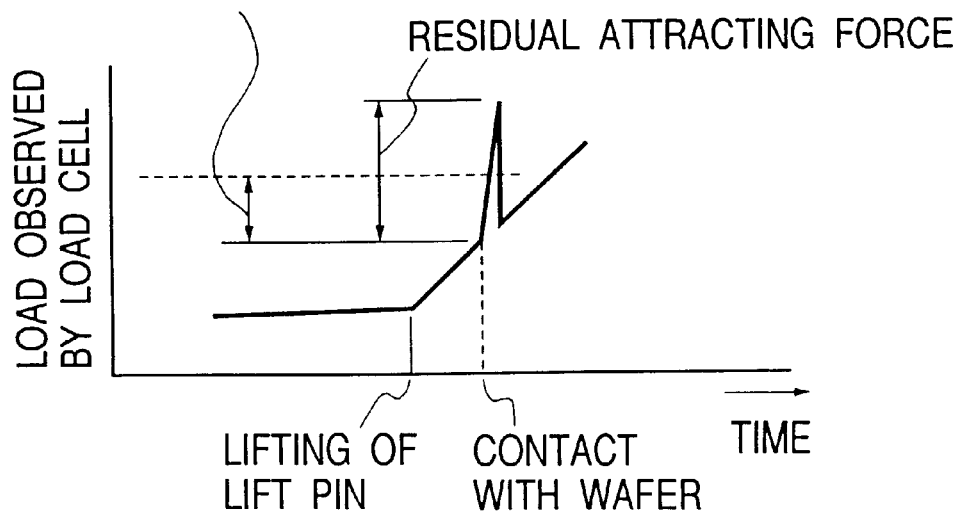
FIG. 8 is a graph showing a load applied to a wafer upon removal of the wafer from the electrostatic chuck shown in FIG. 7.

Upon removal of the substrate 9, as shown in FIG. 8, as the lift pins 30 are lifted, the load observed by the load cell 31 is increased at a specific ratio just as in the case where a spring load is applied by a component such as bellows. Here, when the lift pins 30 are brought in contact with the back surface of the substrate 9 attracted on the chuck with a residual attracting force, the load cell 31 additionally detects a load due to the residual attracting force. Such an additional load due to the residual attracting force is shown as a locally projecting load appearing in FIG. 8. In this embodiment, to prevent the substrate 9 from being cracked or abnormally jumping due to the residual attracting force when the substrate 9 is forcibly pushed up by the lift pins 30, the push-up force of the lift pins 30 is set at an allowable value. The allowable push-up force is stored in the control unit 33, and the lift pins 30 are lifted by the stepping motor 32 on the basis of the allowable push-up force. Specifically, when the load detected using the load cell 31 exceeds the allowable push-up force by lifting the lift pins 30 after the lift pins 30 are brought in contact with the substrate 9, the control unit 33 operates the stepping motor 32 so as to retard the lifting rate of the lift pins 30 or to stop the lifting of the lift pins 30. This prevents the substrate 9 from being damaged or erroneously carried.

Accordingly, using the above control for removing the substrate 9, it becomes possible to start removal of the substrate 9 after plasma extinction and remove the substrate 9 directly after stopping the supply of the DC voltage for electrostatic attraction, and to improve the throughput in carrying the sample.

As described above, with the bipolar type electrostatic chuck forming the first embodiment, having a gas groove in a sample mounting surface, the amounts of electric charges stored on attracting portions corresponding to the positive and negative electrodes directly before stopping the supply of DC voltage for electrostatic attraction are set to be equal to each other, and accordingly, when the supply of the DC voltage is stopped, the electric charges equally stored on both the electrodes are eliminated, that is, no electric charges remain on either of the electrodes. As a result, it is not required to provide any special means for eliminating electric charges stored on the chuck after stopping the supply of the DC voltage. This improves the throughput in carrying the sample.

Further, according to the first embodiment, the same insulating film for electrostatic attraction is formed on the inner electrode and the ring electrode, and the areas of the attracting portions corresponding to the positive and negative electrodes excluding the gas groove portion are equal to each other, and accordingly, the amounts of electric charges stored on attracting portions corresponding to the positive and negative electrodes directly before stopping the supply of a DC voltage for electrostatic attraction are set to be equal to each other, so that when the supply of the DC voltage is stopped, no electric charges remain on either of the electrodes. As a result, it is not required to provide a special means for eliminating electric-charges stored on the chuck after stopping the supply of the DC voltage. This improves the throughput in carrying the sample.

In this way, in the electrostatic chuck having two electrodes as represented by the first embodiment, since the ratio between the areas of the wafer attracting portions of the dielectric film positioned on the two electrodes is specified at 1:1, little residual attracting force is generated, with a result that the time required for eliminating the electric charges stored on the chuck can be shortened. Accordingly, in a sample processing apparatus including the electrostatic chuck according to the first embodiment, it becomes possible to improve the throughput of the apparatus, because the time required for eliminating the electric charges is short, and to prevent the breakage of the wafer upon pushing up the wafer using pushers or the like after termination of the processing of the wafer, because little residual attracting force is generated.

In the electrostatic chuck forming the first embodiment, further, since a pair of the inner electrode and the ring electrode are concentrically disposed, a processing condition is equally applied to the entire substrate in such a manner as to be symmetric around the center of the substrate, so that it is possible to equally process the substrate.

Additionally, in the electrostatic chuck according to the first embodiment, the residual attracting force is eliminated after stopping of supply of DC voltage, and accordingly, even after removal of the substrate from the electrostatic chuck, contaminants having electric charges are suppressed from adhering on the substrate mounting surface as compared with the case where the residual attracting force exists, with a result that there is no fear that contaminants adhere on the back surface of a new substrate.

Although a positive and a negative voltage having the same potential are applied to the inner electrode 11 and the ring electrode 12 in the first embodiment, the values of the voltages applied from the DC power supplies 81a and 81b to the electrodes 11 and 12 may be varied during plasma processing such that the attracting voltages of both the electrodes are equal to each other based on the bias voltage. With this adjustment of the voltages, since the electrostatically attracting areas corresponding to both the electrodes are equal to each other, the electrostatically attracting forces thereof become equal to each other during plasma processing, with a result that it is possible to prevent extreme unevenness of a temperature distribution of the sample surface.

Figure 9A:
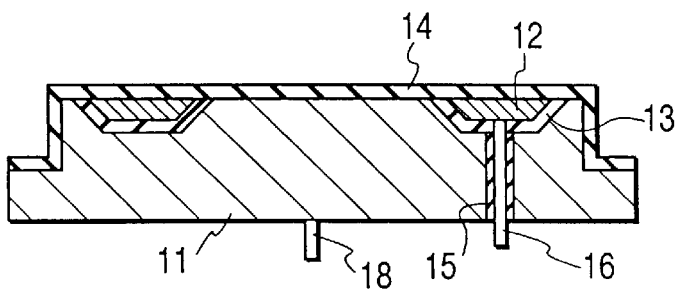
FIGS. 9(*a*) to 9(*c*) are vertical sectional views showing other electrode arrangements of the electrostatic chuck shown in FIG. 1.
Figure 9B:
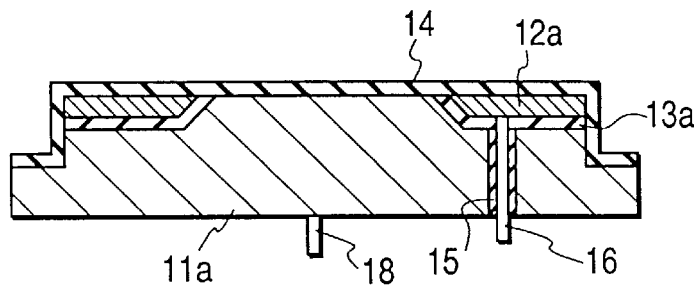
Figure 9C:
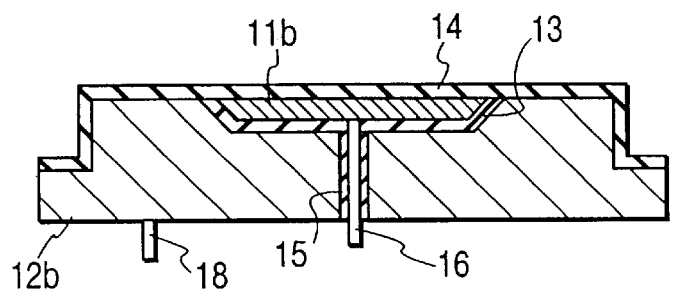

With respect to the arrangement of the pair of electrodes, the first embodiment has been described by way of example with reference to the arrangement shown in FIG. 9(a) in which the electrode 12 is disposed slightly inward from the outer peripheral portion of the electrode 11; however, as shown in FIG. 9(b), the electrode 12 may be disposed at the outer peripheral portion of the electrode 11, or it may be disposed at a central portion of the electrode 11, as shown in FIG. 9(c).

The arrangement shown in FIG. 9(b) is advantageous in that a recess in which a ring electrode 12a is to be provided can be easily machined, which contributes to a reduction in cost. Further, since one end of the ring electrode 12a is in a stress relief state, the ring electrode 12a is not damaged, for example cracked, when it undergoes a thermal cycle. According to the arrangement shown in FIG. 9(c), the outer side of an electrode 12b can be easily machined upon formation of a gas groove; and while the plasma processing apparatus is generally difficult with respect to effecting temperature control of the outer peripheral portion, since the outer peripheral portion of the electrode 12b has a high degree of freedom of design for the gas groove, the temperature control for the outer peripheral portion of the electrode 12b can be easily performed.

Figure 10:
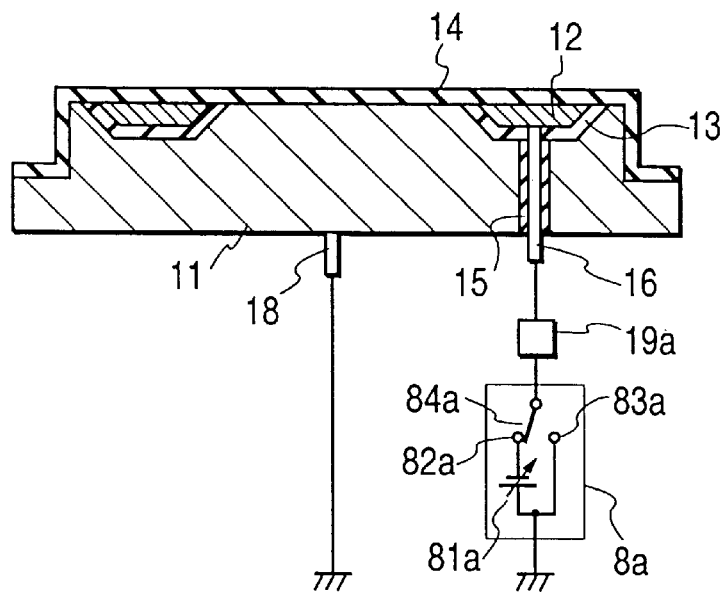
FIG. 10 is a vertical sectional view showing another example of connection of a DC power supply for the electrostatic chuck shown in FIG. 1.
Figure 11:
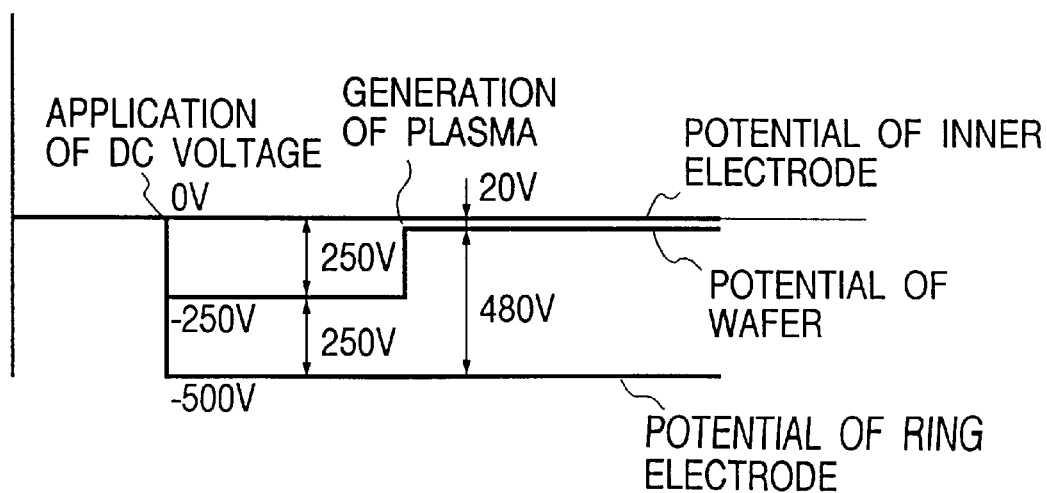
FIG. 11 is a timing diagram showing potentials of a wafer and electrodes of the electrostatic chuck shown in FIG. 10.

With respect to connection of DC power supplies to a pair of electrodes, in the first embodiment, the DC power supplies are connected to the electrodes such that a positive potential is applied to the inner electrode 11 and a negative potential is applied to the ring electrode 12; however, there may be adopted a connection as shown in FIG. 10. According to the connection shown in FIG. 10, the inner electrode 11 is grounded, and the power supply 8a for electrostatic attraction is connected such that a negative potential is applied to the ring electrode 12. FIG. 11 shows potentials of a wafer and the electrodes when the wafer is electrostatically attracted and held on the chuck shown in FIG. 10 and is exposed to a plasma generated by the plasma generating unit. If −500 V is applied to the ring electrode 12, the potential of the wafer attracted on the chuck becomes −250 V and the potential of the inner electrode becomes 0 V. Accordingly, the potential difference (250 V) between the wafer and the ring electrode 12 is equal to the potential difference (250 V) between the wafer and the inner electrode 11. As a result, the attracting forces at both the electrode portions are also equal to each other. Then, when the wafer is exposed to the plasma, a bias potential of about −20 V is generated at the wafer, so that the potential difference between the wafer and each electrode is changed. Here, the potential difference between the wafer and the inner electrode 11 is changed from 250 V to 20 V, and the potential difference between the wafer and the ring electrode 12 is changed from 250 V to 480 V. As a result, the attracting force at the inner electrode portion is decreased, while the attracting force at the ring electrode portion is increased. Thus, a cooling gas flowing on the back surface of the wafer is sufficiently sealed in the vicinity of the outer peripheral portion of the wafer, thereby desirably preventing leakage of the heat transfer gas. Further, while in plasma processing, the temperature at the outer portion of the wafer tends to be increased and thereby the outer portion of the wafer must be more strongly cooled, according to this embodiment, and so the temperature distribution of the wafer during plasma processing can be effectively equalized because the attracting force at the ring electrode 12 portion is increased.

Figure 12:
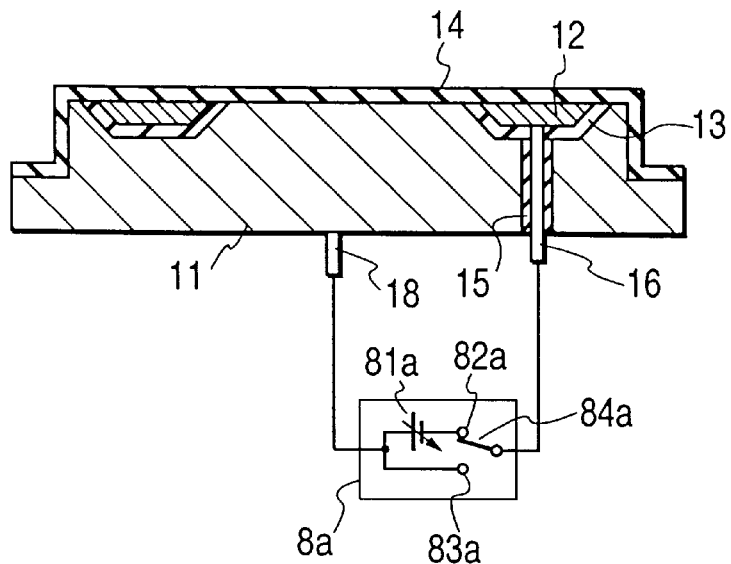
FIG. 12 is a vertical sectional view showing a further example of connection of a DC power supply for the electrostatic chuck shown in FIG. 1.
Figure 13:
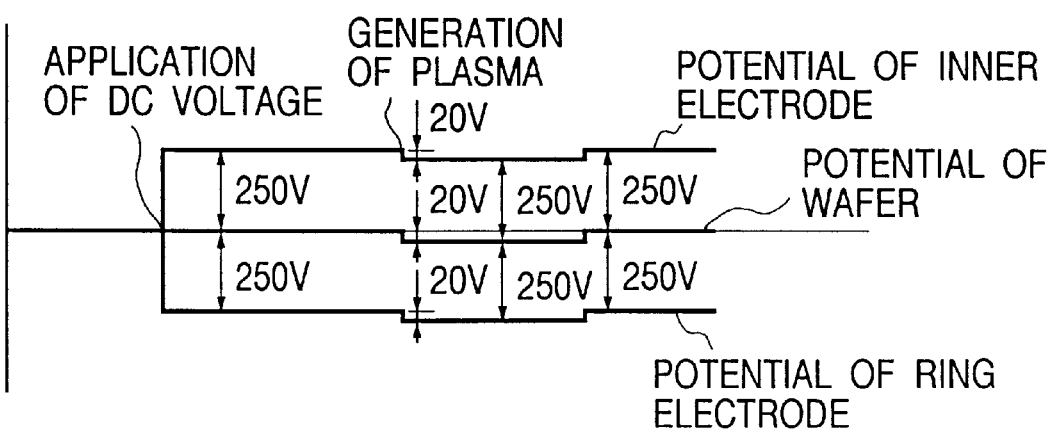
FIG. 13 is a timing diagram showing potentials of a wafer and electrodes of the electrostatic chuck shown in FIG. 12.

FIG. 12 shows another type of connection in which the power supply 8a for electrostatic attraction is connected with the ring electrode 12 and the inner electrode 11, which is in a floating state with respect to the ground potential, and the ring electrode 12 is applied with a voltage having a potential lower than that of the inner electrode 11. In addition, each electrode can be have the same potential applied thereto by operation of a switch 84a. FIG. 13 shows potentials of a wafer, the ring electrode, and the inner electrode when the wafer is electrostatically attracted and held on the electrostatic chuck in which a potential difference of 500 V is generated between the ring electrode 12 and the inner electrode 11 in accordance within the connection shown in FIG. 12. In the electrostatic chuck having such a configuration, the potential of the wafer becomes an intermediate value between potentials of the ring electrode 12 and the inner electrode 11, and the potentials of both the electrodes 11 and 12 become equal to each other. In the case where the wafer is exposed to the plasma in such a state and also a radio frequency voltage is applied to the wafer to generate a bias potential, since the voltages applied to the ring electrode 12 and the inner electrode 11 are in the floating state with respect to ground potential, both the bias potential and the wafer potential are changed, with a result that the potential difference between the wafer and each electrode is not changed. Accordingly, the amount of the electric charge stored on the actual attracting portion of the dielectric film position on each electrode is not changed, so that the attracting force distribution is also not changed. As a result, there can be obtained an effect in which little residual attracting force is generated because the attracting force is not changed. Although in the example shown in FIG. 12, the ring electrode 12 is applied with a voltage having a potential lower than that of the inner electrode 11, it may be applied with a voltage having a potential higher than that of the inner electrode 11. Even in this case, there can be obtained the same effect.

Even in the connection shown in FIG. 10, in some cases, a radio frequency voltage is applied to a wafer for generating a bias potential (usually, about −300 V or less) at the wafer thereby promoting processing of the wafer. In this case, potential differences between the wafer and the electrodes are changed, and thereby there occurs a difference between the amounts of the electric charges stored on the electrode portions. To reduce such an unbalance between the amounts of the electric charges stored on the electrode portions (a residual attracting force), as described above, generation of the plasma may be maintained for a specific time after stopping the supply of the radio frequency voltage, or the DC voltage may be continued to be applied for a specific time after plasma extinction.

In the electrostatic chuck in which the DC power supply is connected as shown in FIGS. 10 and 12, by specifying the amounts of the electric charges stored on the actual attracting portions of the dielectric film positioned on the positive and negative electrodes to be substantially equal to each other, the stored electric charges are smoothly eliminated and little residual attracting force is generated. In the case where a very large attracting force is required, however, a large DC voltage its required to be applied between the positive and negative electrodes. In this case, the amounts of electric charges stored on the dielectric film are naturally increased, so that it takes several seconds or several tens of seconds to eliminate the stored electric charges. To limit the increased time required for eliminating the stored electric charges, a voltage having a polarity reversed to that applied during electrostatic attraction may be applied between the positive and negative electrodes. Thus, there can be provided an electrostatic chuck and a sample processing apparatus which are capable of shortening the time required for eliminating the stored electric charges.

Next, a second embodiment of the present invention will be described with reference to FIGS. 14 to 17.

Figure 14:
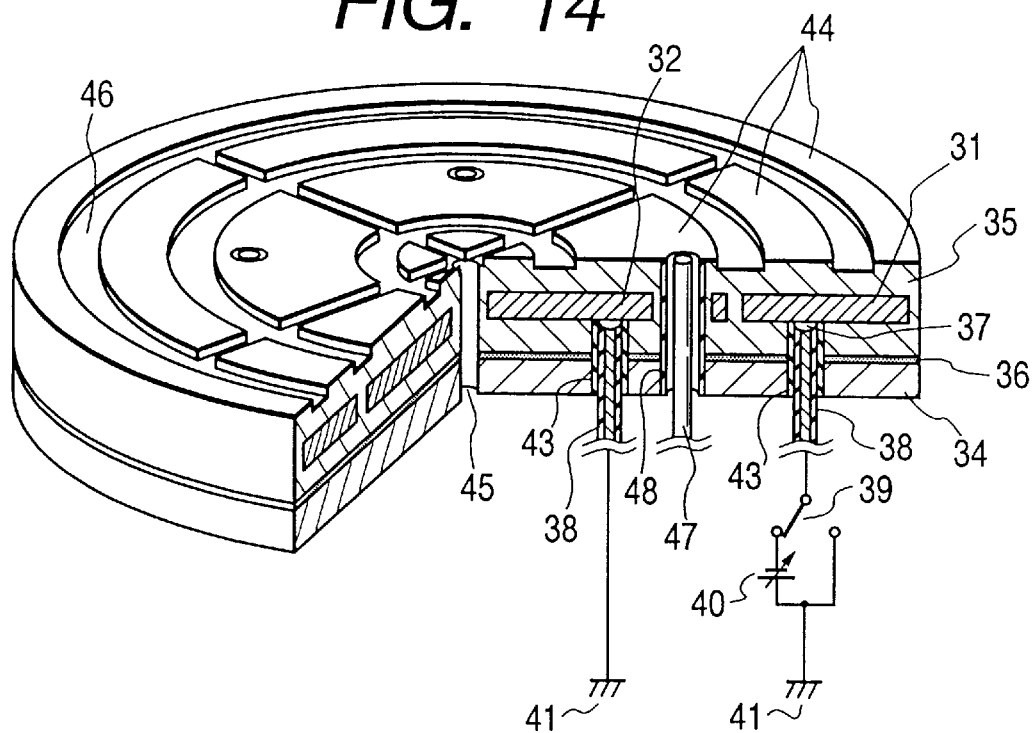
FIG. 14 is a perspective view showing an electrostatic chuck representing a second embodiment of the present invention.
Figure 15:
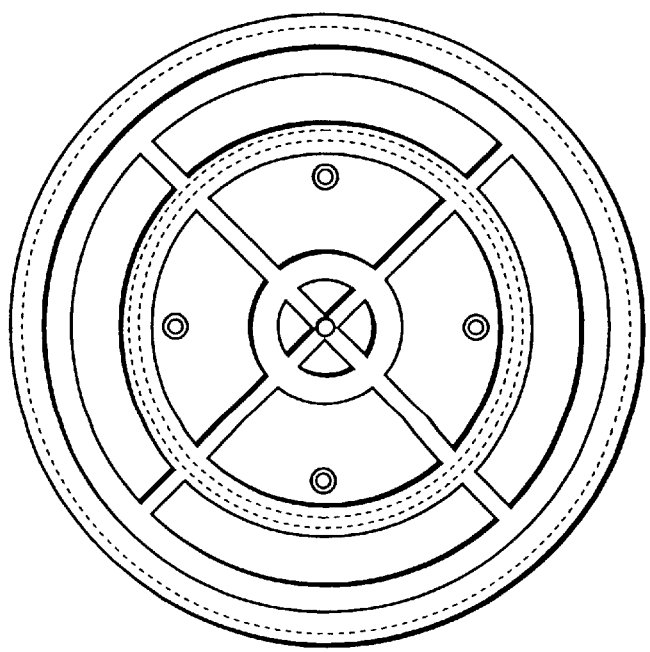
FIG. 15 is a plan view of the electrostatic chuck shown in FIG. 14.

Referring to FIG. 14, there is shown a basic structure of an electrostatic chuck forming the second embodiment of the present invention. A dielectric film 35 is fixed on an aluminum block 34 through an adhesive layer 36. The dielectric film 35 is formed of an alumina sintered body. Two electrodes, a ring electrode 31 and an inner electrode 32, are concentrically buried in the dielectric film 35. Each of the two electrodes 31 and 32, made from tungsten, has a thickness of about 50 to 100 $\mu$m. A DC voltage is applied to each of the electrodes 31 and 32 through a lead wire 38 perfectly sealed by an insulating resin layer 43. The lead wire 38 is brazed with each electrode at a portion 37. In this embodiment, ground potential is applied to the inner electrode 32, and a DC power supply 40 is connected to the ring electrode 31 through a switch 39. The ring electrode 31 can be connected to the minus potential of the DC power supply 40 or the earth 41 by turning the switch 39. When a negative potential is applied to the ring electrode 31 by the switch 39 in a state where a wafer is mounted on a surface 44 of the dielectric film 35, a potential difference is generated between the wafer and each electrode. This allows the wafer to be electrostatically attracted and fixed on the contact surface 44. When the ring electrode 31 is grounded by reversely turning the switch 39, an electric charge stored between the wafer and each electrode is eliminated.

While the total thickness of the dielectric film 35 is 1 mm, the thickness of the dielectric film 35 on the electrodes 31 and 32 is 300 $\mu$m. The surface roughness of the dielectric film is 3 $\mu$m. A gas groove 46 having a depth of about 20 $\mu$m is formed in the surface 44 of the dielectric film 35, as shown in FIG. 14. The gas groove 46 is formed in such a shape that a heat transfer gas for promoting cooling of a wafer during processing effectively flows over the entire back surface of the wafer. Into the gas groove 46, there is introduced a heat transfer gas from a heat transfer gas inlet 45 through an external pipe (not shown). The gas groove 46 is formed in a pattern capable of giving a desirable temperature distribution to the wafer during processing. In this embodiment, the ratio between an area of a wafer attracting portion positioned on the ring electrode and an area of a wafer attracting portion positioned on the inner electrode is set at 1:1. Also, a ratio between an area of a gas groove portion on the ring electrode and an area of a gas groove portion on the inner electrode is set at 1:1. The electrostatic chuck is provided with four lift pins 47 which are concentrically arranged. The lift pin 47 is inserted in an insulating sleeve 48 to be insulated from the electrodes 31 and 32 and the aluminum block 34. The lift pins 47 are vertically driven by a lifting mechanism (not shown) such as an external motor, which are used for carrying a wafer, the processing of which has been terminated.

Figure 16A:
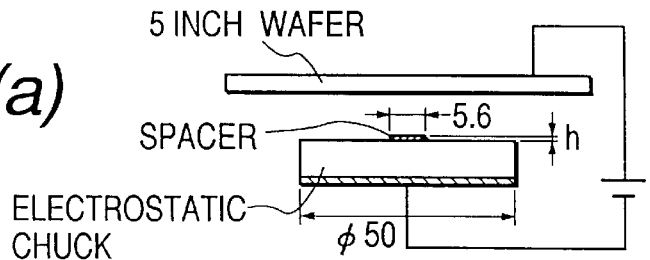
FIGS. 16(a) to 16(c) are diagrams each showing a relationship between a gap and an attracting force upon electrostatic attraction.
Figure 16B:
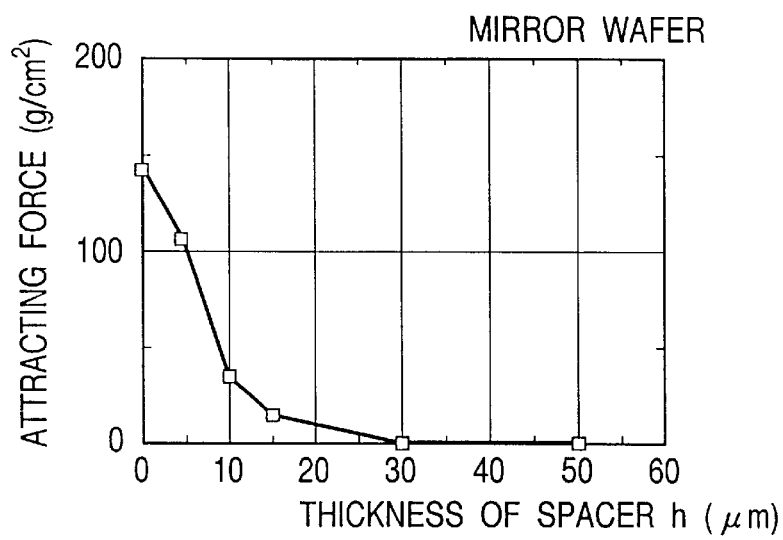
Figure 16C:
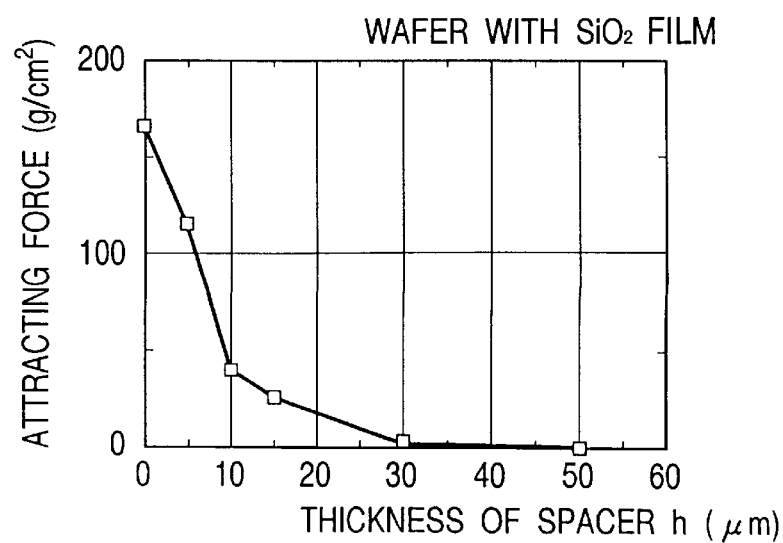

With the electrostatic chuck having the above configuration, the depth of the gas groove is about one-tenth of the thickness of the dielectric film on the electrodes, and thereby the gas groove similarly generates an electrostatically attracting force which is different from those of the actual attracting portions. FIGS. 16($a$) to 16($c$) show a relationship between an electrostatic attracting force and the distance between a wafer and a dielectric film. To examine a wafer attracting force, a spacer was provided on an electrostatic chuck, as shown in FIG. 16($a$). The data are shown in FIGS. 16($b$) and 16($c$), wherein FIG. 16($b$) shows the case of using a mirror wafer and FIG. 16($c$) shows the case of using a wafer with a SiO2 film. From the data shown in FIGS. 16($b$) and 16($c$), it becomes apparent that in each case, little attracting force is generated when the thickness of the spacer, that is, the distance between the wafer and the dielectric film is more than 30 $\mu$m. Accordingly, for a gas groove having the depth smaller than 30 $\mu$m, an electrostatic attracting force in the gas groove must be taken into account. In particular, since an electrostatic attracting force is certainly generated in a gas groove having the depth smaller than 20 $\mu$m, it must be examined.

In this embodiment, since the areas of the actual attracting portions on the inner electrode and the ring electrode are equal to each other, and also the areas of the gas groove portions on the inner electrode and the ring electrode are equal to each other, the electric charges stored on the actual attracting portions on the ring electrode and the inner electrode are equal to each other, with a result that little residual attracting force is generated after stopping the supply of the DC voltages, as in the first embodiment.

In the electrostatic chuck of the second embodiment, the dielectric film is formed of an alumina sintered body. In general, a dielectric film of an electrostatic chuck is made from a ceramic material. The ceramic material, however, has a characteristic such that the resistivity is dependent on the applied voltage and the temperature, as described above. FIG. 17 shows a change in resistivity of the dielectric film used for the electrostatic chuck of the second embodiment depending on the temperature of the dielectric film when a voltage of 200 V is applied thereto. From this figure, it is revealed that the resistivity of the dielectric film at −50° C. is about 30 times that of the dielectric film at 20° C. In the case of using a dielectric film having an excessively low resistivity, an electric charge is not stored between the surface of the dielectric film and the back surface of the wafer, and thereby an attracting force is not generated. On the other hand, in the case of using a dielectric film having an excessively high resistivity, the discharge time constant of an electric charge stored on the surface of the dielectric film and the back surface of the wafer becomes larger, and thereby the time required for eliminating the stored electric charge is made longer. In this case, a residual attracting force remains.

In a process requiring a fine processing with a good reproducibility, the temperature of an electrostatic chuck is generally controlled for managing the temperature of a wafer during processing. However, since the wafer temperature range is changed depending on the kind of process, there is a possibility that the electrostatic chuck having a dielectric film largely depending on temperature change cannot be used for a process having a certain wafer temperature range. For example, in an etching apparatus, the wafer temperature is required to be controlled in a range of a low temperature, about −60° C. to about 100° C. In a film formation apparatus using CVD or sputtering, the wafer temperature is in a range of 100° C. to a high temperature, about 700° C. In this case, the resistivity of a dielectric film is adjusted by addition of an impurity, such as a metal oxide, in a basic material of the dielectric film in order that it becomes a suitable value in a service temperature range.

An electrostatic chuck having the dielectric film thus adjusted is able to quickly eliminate the electric charges on the chuck while ensuring a sufficient attracting force in the entire range of service temperatures. Also, a sample processing apparatus using such an electrostatic chuck is able to improve the working ratio because one apparatus can carry out processes in a wide temperature range.

Additionally, in the case of using the electrostatic chuck for processes having different service temperature ranges, the attracting force differs between the service temperature ranges of the processes because the resistivity of the dielectric film is dependent on the temperature. The changed attracting force varies the thermal conductivity of an attracting portion, which possibly results in a change in the process. To cope with such an inconvenience, the applied voltage is changed to generate a constant attracting force in a service temperature range on the basis of the previously examined data on a change in resistivity of the dielectric film in the service temperature range.

A sample processing apparatus including the electrostatic chuck having the above configuration is allowed to usually process wafers with a good producibility.

In the above-described first and second embodiments, actual attracting areas corresponding to positive and negative electrodes are set to be equal to each other for making the amounts of positive and negative electric charges stored on an electrostatically attracting film (insulating film 14, dielectric film 35) equal to each other directly before stopping the supply of DC voltages for electrostatic attraction. In some cases, however, the above attracting areas cannot be set to be equal to each other. In these cases, there may be adopted the following expedient may be adopted.

For example, assuming that in FIG. 14, the area of the actual attracting portion on the inner electrode 32 is taken as 54 cm$^2$ and the area of the actual attracting portion on the ring electrode 31 is taken as 152.5 cm$^2$, the area of the actual attracting portion on the ring electrode 31 side is 2.8 times the area of the actual attracting portion on the inner electrode 32 side. Accordingly, in order that amounts of electric charges stored between the attracted wafer and the dielectric film on the electrodes 31 and 32 are substantially equal to each other when a service voltage of 400 V is applied, the surface roughness of the dielectric film on the inner electrode 32 is set at 3 μm and the surface roughness of the dielectric film on the ring electrode 31 is set at 3.9 μm on the basis of the principle described with reference to FIGS. 22 to 25. Here, potentials generated between the wafer and the electrodes 32 and 31, and the electrostatic capacities of the dielectric film on the electrodes 32 and 31, are calculated on the basis of the above-described equations, as follows: namely, the potential between the wafer and the inner electrode 32 is 274 V and the potential between the wafer and the ring electrode 31 is 126 V; and the electrostatic capacity of the dielectric film on the inner electrode 32 is 16 nF and the electrostatic capacity of the dielectric film on the ring electrode 31 is 35 nF. On the basis of these conditions, the amounts of electric charges stored on the dielectric film on the electrodes 32 and 31 are calculated as follows: namely, the amount of the electric charge stored on the dielectric film on the inner electrode 32 is $4.4 \times 10^{-6}$ coulomb, and the amount of the electric charge stored on the dielectric film on the ring electrode 31 is $4.4 \times 10^{-6}$ coulomb. This result shows that the amounts of the electric charges stored on the dielectric film on the electrodes 32 and 31 are substantially equal to each other. Accordingly, when supply of the DC voltages is stopped in such a state, generation of a residual attracting force is suppressed on the basis of the principle described with reference to FIGS. 22 to 25, with a result that the time required for eliminating the stored electric charges is shortened.

Specifically, when an electrostatic chuck is designed such that the product of a ratio between electrostatic capacities of actual attracting portions of a dielectric film on respective electrodes and a ratio between resistances of the actual attracting portions of the dielectric film on the electrodes is set at approximately 1, that is, the relationship of Ca×Ra= Cb×Rb obtained from the relationship of Ca×Va=Cb×Vb is satisfied, the amounts of the electric charges stored on the actual attracting portions of the dielectric film on the electrodes during attraction of the wafer are equal to each other. The electrostatic chuck thus designed makes it possible to suppress generation of a residual attracting force.

In the above description, the attracting area on the inner electrode 32 side is made small; however, in some processing conditions, the attracting area on the ring electrode 31 side may be made smaller. As a result of an experimental examination of a relationship between an electrostatic attracting force and a wafer temperature when a gas is supplied to the back surface of the wafer, it was found that the wafer is more effectively cooled as the electrostatic attracting force becomes larger. On the other hand, when the electrostatic capacities (Q=C×V) at respective electrode portions are equal to each other, the attracting force per unit area becomes larger as the electrostatic attracting area becomes smaller. On the basis of the data, in the case where the outer portion of a sample is required to be more strongly cooled or heated in consideration of a temperature distribution within a sample surface upon processing of the sample, the temperature distribution can be improved by supplying a cooling gas on the back surface of the sample and strongly attracting and holding the outer portion of the sample. Accordingly, in the case where the attracting areas are different, by suitably setting the attracting areas on respective electrodes, the temperature distribution within the sample surface can be adjusted.

Figures 18A, 18B:
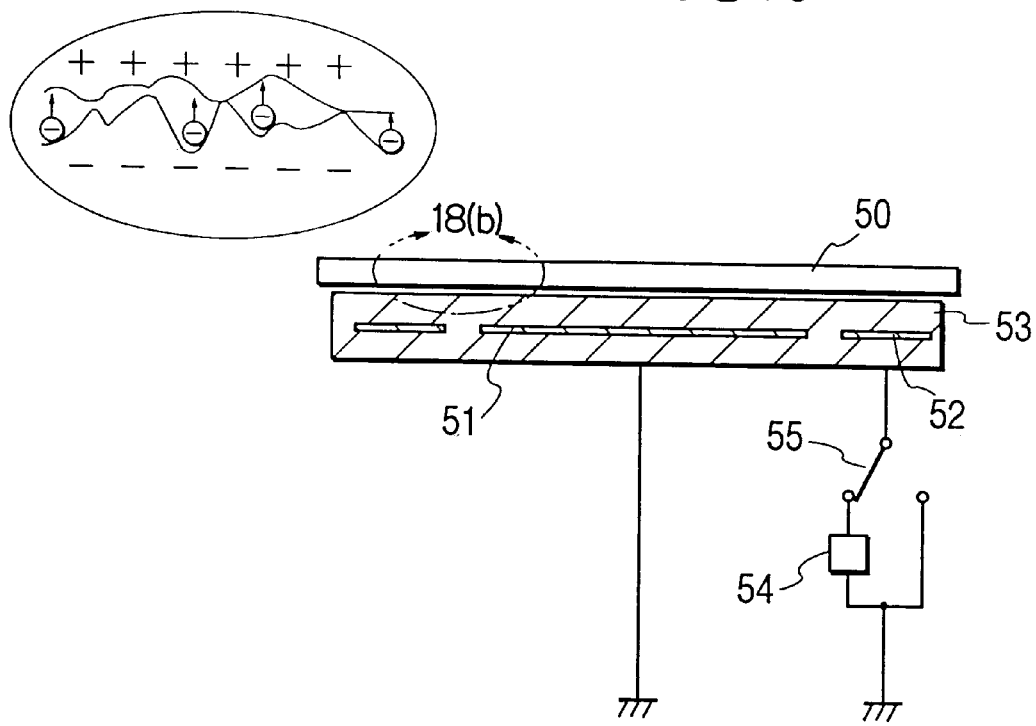
FIGS. 18(a) and 18(b) show a sectional view and an enlarged view showing a third embodiment using the electrostatic chuck of the present invention, showing a state in which contaminants adhering on a dielectric film are transferred on a dummy wafer.

Next, a third embodiment of the electrostatic chuck of the present invention will be described with reference to FIGS. 18(a) and 18(b). In this embodiment, a new dummy wafer 50 is placed on a dielectric film 53 and is attracted by applying a voltage, which is larger than a voltage applied in the actual processing, from a DC power supply 54. As a result, contaminants adhering on the surface of the dielectric film, for example, contaminants having a negative electric charge and which are not allowed to be usually made repulsive by an negative electric charge generated during usual attraction of a wafer, are made repulsive by a negative electric charge larger than that generated during usual attraction of the wafer, and are transferred on the back surface of the wafer as shown in the enlarged view of FIG. 18(b). The dummy wafer is then removed from the chuck in the same manner as that used for usual carrying of the wafer. Thus, the contaminants adhering on the dielectric film can be removed. Although in this figure, only the contaminants having a negative electric charge are shown; however, actually, contaminants having a positive electric charge adhere on the surface of the dielectric film.

In the electrostatic chuck in which the above operation is periodically repeated, it is possible to reduce the number of contaminants adhering on the back surface of a wafer to be processed, and to usually subject wafers to a clean process. Accordingly, a processing apparatus including the electrostatic chuck in this embodiment is allowed to improve the yield of products. In addition, since the number of disassembling operations for cleaning contaminants stored in the apparatus can be reduced, the working ratio of the apparatus can be enhanced.

Figure 19:
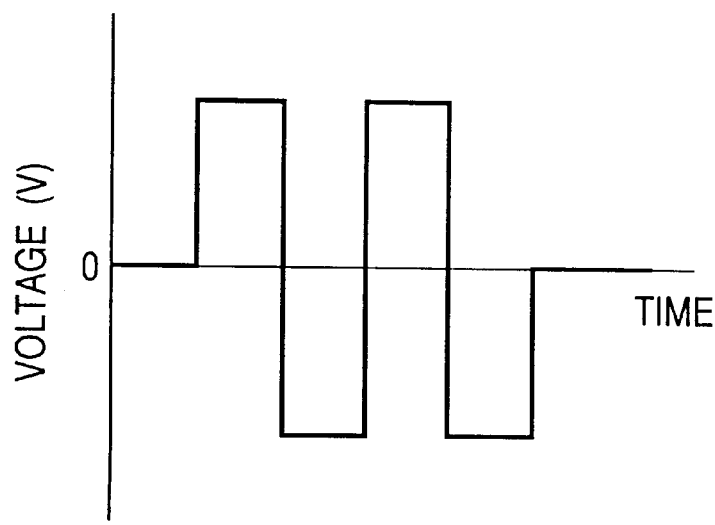
FIG. 19 is a waveform diagram showing another example of removal of contaminants shown in FIG. 18, showing a DC voltage applied to the electrostatic chuck in such a manner as to be alternately changed in polarity.

Although the manner of removing contaminants having a positive or negative electric charge has been described in the third embodiment, another manner of removing contaminants having positive and negative electric charges will be described with reference to FIG. 19. In this case, the DC power supply shown in FIG. 18 is replaced with a DC power supply capable of suitably switching polarity (positive or negative) of an applied voltage. A new dummy wafer 50 is placed on the surface of the dielectric film 53, and a DC voltage having an absolute value larger than that of a voltage applied for usual attraction of a wafer is applied in such a manner as to be alternately changed in polarity, as shown in FIG. 19. With this operation, contaminants not allowed to be removed by the operation shown in FIG. 18(a), that is, contaminants having a positive electric charge and which are electrostatically attracted on the dielectric film can be transferred on the dummy wafer, to be thus removed from the chuck. According to this embodiment, therefore, the dielectric film can be effectively cleaned.

In this embodiment, a new dummy wafer is used for removing contaminants on the dielectric film; however, it may be replaced with any member made from a conductive or semiconducting material in a clean state. However, it is best to avoid a member containing a material capable of causing heavy metal contamination.

In addition, although a DC voltage is applied in such a manner as to be alternately changed in polarity in this embodiment, the present invention is not limited thereto, and for example, the same effect can be obtained by applying an AC voltage.

Figure 20:
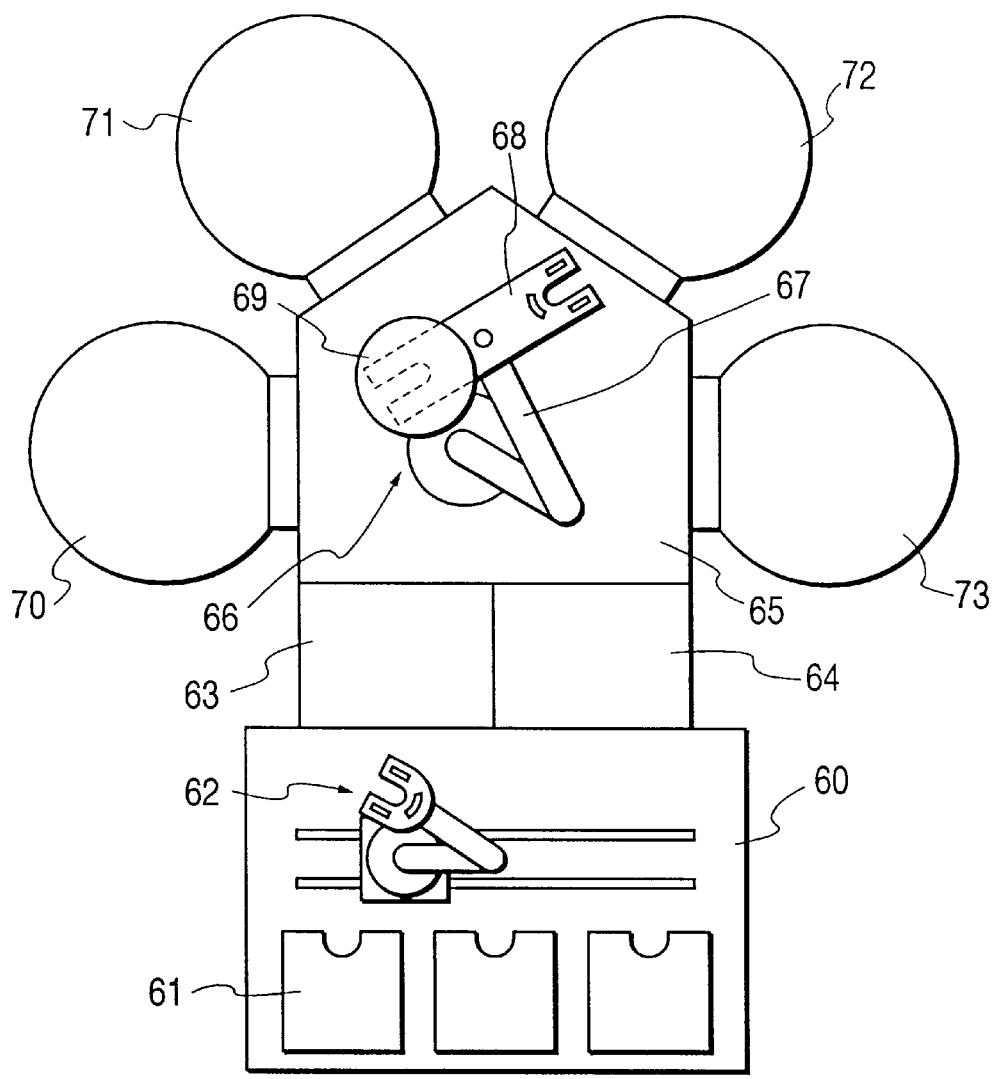
FIG. 20 is an elevational view showing a sample processing apparatus as a fourth embodiment using the electrostatic chuck of the present invention, in which the electrostatic chucks are used for all wafer holding portions of the apparatus.
Figure 21:
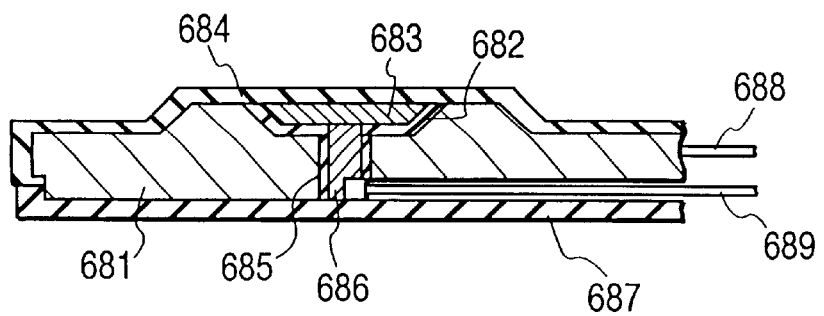
FIG. 21 is a sectional view showing the details of a wafer holding portion of a carrying robot in the apparatus shown in FIG. 20.

A fourth embodiment using the electrostatic chuck of the present invention will be described with reference to FIGS. 20 and 21. FIG. 20 shows the configuration of a sample processing apparatus using the electrostatic chuck of the present invention. The sample processing apparatus is composed of an atmospheric loader unit and a vacuum processing unit. The atmospheric loader unit has cassette mounting areas on which a plurality of cassettes 61 can be mounted. The atmospheric loader unit also has an atmospheric carrying robot 62 for carrying wafers contained in each cassette 61 into the vacuum processing unit or for returning wafers which have been processed in the vacuum processing unit to the cassette 61. The vacuum processing unit has a load lock chamber 63, unload lock chamber 64, and processing chambers A, B, C and D, which are indicated by reference numerals 70, 71, 72, and 73, respectively. These chambers are arranged around a vacuum carrying chamber 65 and are connected thereto. The load lock chamber 63 and the unload lock chamber 64 are positioned on the side of the atmospheric loader 60. A vacuum carrying robot 66 is provided in the vacuum chamber 65. The vacuum carrying robot 66 includes an arm 67. The leading end of the arm 67 has a hand 68. The vacuum carrying robot 66 is actuated in such a manner that the hand 68 is allowed to be inserted in each of the chambers 63, 64, 70, 71, 72 and 73. The hand 68 has wafer mounting surfaces disposed on both ends thereof. The wafer mounting surface disposed at the leading end of the hand 68 is formed with the electrostatic chuck shown in FIG. 21. The electrostatic chuck is composed of an outer electrode 681, an insulating film 682, an inner electrode 683, and an insulating film 684 for electrostatic attraction. The outer electrode 681 disposed at the leading end of the hand 68 has, for example, three projections. A recess is formed in part of each projection, and the inner electrode 683 is provided in the recess. An insulating sleeve 685 is mounted in the recess of the outer electrode 681 in such a manner as to pass through the outer electrode 681, and an electrode core 686 is provided in the insulating sleeve 685. An insulating film 682 is formed on the surface of the recess by thermal spraying, and the inner electrode 683 is formed on the insulating film 682 by thermal spraying. The inner electrode 683 can be easily connected to the electrode core 686 by thermal spraying of the inner electrode 683. On the top surfaces of the outer electrode 681 and the inner electrode 683, there is formed an insulating film 684 by thermal spraying. A lead wine 689 is connected to the electrode core 686, and a lead wire 688 is connected to the outer electrode 681. The lead wires 688 and 689 are connected to a power supply for electrostatic attraction (not shown). An insulating cover 687 is provided on the bottom surface of the outer electrode 681. Here, in order to suppress adhesion of contaminants, the wafer contact surface of an electrostatic attracting portion formed on the projection is made as small as possible. Further, the areas of electrostatic attracting surfaces corresponding to the outer electrode 681 and the inner electrode 683 are equal to each other.

With a sample processing apparatus having the above configuration, a wafer is taken out of the cassette 61 and is carried into the load lock chamber 63 by the atmospheric robot 62. The wafer thus transferred into the load lock chamber 63 is then carried into a designated processing chamber (for example, processing chamber 71) by the vacuum carrying robot 66. At this time, the hand 68 receives at the one end the wafer 69, which has been processed in the processing chamber 71, is turned, and carries a non-processed wafer into the processing chamber 71. The already processed wafer held by the one end of the hand 68 is carried into the next processing chamber (for example, processing chamber 70) by the vacuum carrying robot 66. On the other hand, the wafer to be processed in a different processing chamber (for example, processing chamber 72) is carried by a similar operation of the atmospheric carrying robot 62 and the vacuum carrying robot 66.

Here, when the vacuum carrying robot 66 receives the wafer from the load lock chamber 63 or each processing chamber, positive and negative DC voltages having the same potential are applied to the outer electrode 681 and the inner electrode 683, so that the amounts of electric charges stored on the electrostatically attracting surfaces of the insulating film positioned on the electrodes 681 and 683 are equal to each other. When the vacuum carrying robot 66 delivers the wafer into the unload lock chamber 64 or each processing chamber, the supply of the DC voltages applied to the outer electrode 681 and the inner electrode 683 is stopped, so that the electric charges stored on the electrostatic attracting surfaces of the insulating film positioned on the electrodes 681 and 683 are eliminated. As a result, residual attracting forces do not remain on the electrostatic attracting surfaces. Thus, the wafer is easily removed from the electrostatic attracting surfaces. The removal of the wafer from the electrostatic attracting surfaces of the hand 68 is performed using lift pins, as shown in FIGS. 7 and 8. In removal of the wafer from the hand 68, supply of the DC voltages for electrostatic attraction is stopped when the wafer on the hand 68 has arrived at a specified position and stopped by the vacuum carrying robot 66. At the same time, the lifting of the lift pins is started when the wafer has arrived at the specific position and has stopped. Even when the electric charges stored on the electrostatic chuck are not perfectly eliminated at the time when the lift pins are brought in contact with the wafer, the wafer is not damaged because, as shown in FIGS. 7 and 8, the push-up force of the lift pins is adjusted by controlling the action of a stepping motor while detecting the push-up force of the lift pins using a load cell. As a result, the wafer can be removed without lifting the lift pins after an elapse of several seconds (about two or three seconds) until the electric charges polarized on the positive and negative electrodes are eliminated after the supply of the DC voltages has stopped, to thereby improve the throughput in carrying the wafer. In addition, if the period of time, several seconds, until the electric charges are eliminated does not affect the entire throughput of wafer processing, it is not required to control the push-up force of the lift pins using a load cell.

Further, since the amounts of the electric charges stored on the electrostatic attracting surfaces of the insulating film are equal to each other directly before the supply of the DC voltages has stopped, the residual attracting force can be certainly eliminated merely by stopping application of the DC voltages for electrostatic attraction. Accordingly, even in the case of using the electrostatic chuck as the wafer holding portion of the atmospheric carrying robot 62, it can transfer a wafer on a containing stage in a cassette without a problem.

As described above, according to the sample processing apparatus of this embodiment, since a wafer can be certainly held on the arm by use of the electrostatic chuck of the present invention as a wafer holding portion of a wafer carrying robot, the reliability in carrying wafers can be improved.

Also, since a wafer can be certainly held on the arm, the carrying speed of the carrying robot can be increased, to thereby improve the throughput. Further, in a case where the electrostatic chuck of the present invention is used for the wafer carrying robot provided with a hand having two wafer holding portions on the arm, when a wafer which has been processed in a processing chamber is exchanged with a non-processed wafer, the wafer is not removed by centrifugal force even when increasing the turning speed as the wafer is turned from one end to the other end of the hand, that is, the arm (or the hand) is rotated by the carrying robot. Accordingly, exchange of wafers in the processing chambers can be quickly performed, thereby reducing any loss of time in wafer processing.

In addition, the atmospheric carrying robot uses an electrostatic chuck in this embodiment, it may adopt a different holding means such as a vacuum chuck.

Although the electrostatic chuck, and the method of and apparatus for processing a sample using the electrostatic chuck, according to the present invention have been described by way of example in the first, second, third and fourth embodiments, the most important point of the present invention lies in the fact that in an electrostatic chuck applied to a sample processing apparatus or a sample carrying apparatus, the amounts of electric charges stored on a dielectric film, directly before the supply of a DC voltage applied between positive and negative electrodes is stopped, are equal to each other. An electrostatic chuck having such a configuration is allowed to smoothly eliminate the stored electric charges and to substantially prevent generation of a residual attracting force. Additionally, in the sample processing apparatus, represented by a plasma processing apparatus or a vacuum processing apparatus, using the electrostatic chuck, a sample can be certainly held during processing or carrying the wafer, or upon delivery of the wafer to the next processing chamber, the wafer can be quickly removed from the chuck without damage to the wafer, so that it is possible to improve the working ratio of the apparatus.

As described above, in the electrostatic chuck of the present invention, since the amounts of electric charges stored on electrostatic attracting surfaces of an insulating film corresponding to the positive and negative electrodes, directly before stopping the supply of DC voltages applied to the electrodes, are equal to each other, the electric charges stored on the electrostatic attracting surfaces of the insulating film can be quickly eliminated without separately providing any electric charge eliminating step after the supply of the DC voltages has stopped, so that little residual attracting force is generated and the time required for eliminating the stored electric charges is shortened.

According to the sample processing apparatus using the electrostatic chuck of the present invention, since little residual attracting force is generated and the time required for eliminating the stored electric charges is shortened, lowering of the processing ability of the processing apparatus can be prevented. In addition, according to the electrostatic chuck of the present invention, it takes two or three seconds to eliminate the stored electric charges. Such a time is not regarded as a loss of time in consideration of the time required for operating lift pins or the like. However, if needed, the electric charges stored on the dielectric film can be more quickly eliminated by applying voltages having polarities reversed with respect to the voltages for electrostatic attraction after stopping the applied voltages.

In particular, according to the plasma processing apparatus using the electrostatic chuck of the present invention, it is possible to eliminate an unbalance between the amounts of electric charges generated during plasma processing, which is performed simultaneously with application of a radio frequency voltage for generating a bias voltage, by maintaining generation of the plasma for a specific time after stopping the application of the radio frequency voltage. Also, it is possible to eliminate an unbalance between amounts of electric charges generated during plasma processing by applying the DC voltages for electrostatic attraction for a specific time after plasma extinction. Further, since elimination of electric charges stored on the electrostatic attracting insulating film after stopping the supply of the DC voltages for electrostatic attraction is performed within a processing gas exhausting time, it is possible to prevent lowering of a processing ability due to the electrostatic chuck.

According to the electrostatic chuck of the present invention, particularly, since a residual attracting force is eliminated after stopping the supply of the DC voltages, a substrate mounting surface is prevented from being deposited with contaminants having an electric charge, as compared with a chuck in which there exists a residual attracting force, so that the back surface of a new substrate is prevented from being deposited with contaminants.

In the case where contaminants adhere on the electrostatic chuck of the present invention, the contaminants, which adhere on a dielectric film (insulating film for electrostatic attraction) of the chuck, can be transferred on a dummy wafer to be thus removed by applying a voltage higher than the usual applied voltage between the electrodes for electrostatic attraction or by applying an AC voltage having an absolute value larger than that of the usual applied voltage between the electrodes. Thus, by periodically repeating the above operation, it is possible to reduce contaminants adhering on the back surface of a product wafer.

Additionally, in the case where the electrostatic chucks of the present invention are used for all of wafer holding portions of a sample processing apparatus, since little residual attracting force is generated at each of the wafer holding portions, it is possible to certainly deliver a wafer because the wafer is easily removed from a wafer holding portion, and hence the reliability of the apparatus is significantly enhanced.

Additionally, in the case where a power failure occurs during processing of a wafer held by an electrostatic chuck, the attracting force of the wafer is reduced and it is floated and offset by the pressure of a heat transfer gas remaining on the back surface of the wafer. In this case, the pressure of the heat transfer gas may be reduced while the attracting force of the wafer is maintained. Specifically, when the supply of the DC voltages to the electrostatic chuck is abruptly stopped, the attracting force may be maintained for a specific period of time by auxiliary batteries attached to the DC power supplies for supplying voltages to the inner electrode and ring electrode, and during the specific period of time, the heat transfer gas may be exhausted. One of the simple methods for exhausting a heat transfer gas is to provide a valve for opening a supply line of the heat transfer gas in the supply line, thereby connecting the supply line communicating with the back surface of the wafer into a processing chamber in which the wafer is disposed when the supply of the voltages is stopped. According to this method, when the supply of the voltages is stopped, the heat transfer gas flows in the processing chamber, and the pressure at the back surface is balanced against the pressure of the processing chamber, to thereby prevent the wafer from being offset.

What is claimed is:

1. An electrostatic chuck comprising:

a pair of electrodes having different polarities; and a dielectric film, formed on top surfaces of said pair of electrodes, on which a sample is to be electrostatically attracted and held when a DC voltage is applied between said pair of electrodes;

wherein the product of a ratio between electrostatic capacities between said positive and negative electrodes and said wafer and a ratio between resistances of portions of said dielectric film on said positive and negative electrodes is set to be approximately 1, by changing areas and surface roughnesses of actual attracting portions of said dielectric film corresponding to said positive and negative electrodes.

2. A sample processing apparatus for processing a sample electrostatically attracted and held on an electrostatic chuck, said electrostatic chuck comprising:

a pair of electrodes having different polarities;

a dielectric film, formed on top surfaces of said pair of electrodes, on which a sample is to be electrostatically attracted and held when a DC voltage is applied between said pair of electrodes;

wherein a recess not in contact with the back surface of said sample is formed in a surface of said dielectric film on which said sample is disposed; and amounts of electric charges of different polarities stored on attracting portions of the surface of said dielectric film excluding said recess are equal to each other; and wherein the product of a ratio between electrostatic capacities between said electrodes having different polarities and said wafer and a ratio between resistances of portions of said dielectric film on said electrodes having different polarities is set to be approximately 1, by changing areas and surface roughnesses of said attracting portions of the surface of said dielectric film on said electrodes having different polarities.

3. A sample processing apparatus according to claim 2, further comprising means for maintaining application of the DC voltage between said electrodes for a specific time after plasma extinction.

4. A sample processing apparatus according to claim 2, further comprising means for removing said sample from said sample mounting surface without performing any other step after stopping supply of the DC voltage between said electrodes.

5. A sample processing apparatus according to claim 2, wherein said processing of said sample is plasma processing, and said apparatus comprises means for applying a radio frequency voltage for generating a bias voltage during said plasma processing, and means for maintaining generation of the plasma for a specific time after stopping supply of said radio frequency voltage upon termination of processing said wafer.

6. A sample processing apparatus according to claim 5, further comprising means for maintaining application of the DC voltage between said electrodes for a specific time after plasma extinction.

\* \* \* \* \*